United States Patent
Ripley et al.

(10) Patent No.: US 9,419,567 B2
(45) Date of Patent: Aug. 16, 2016

(54) PROCESS-COMPENSATED HBT POWER AMPLIFIER BIAS CIRCUITS AND METHODS

(71) Applicant: Skyworks Solutions, Inc., Woburn, MA (US)

(72) Inventors: David Steven Ripley, Marion, IA (US); Philip John Lehtola, Cedar Rapids, IA (US); Peter J. Zampardi, Jr., Newbury Park, CA (US); Hongxiao Shao, Thousand Oaks, CA (US); Tin Myint Ko, Newbury Park, CA (US); Matthew Thomas Ozalas, Novato, CA (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 199 days.

(21) Appl. No.: 13/917,552

(22) Filed: Jun. 13, 2013

(65) Prior Publication Data

US 2013/0344825 A1    Dec. 26, 2013

Related U.S. Application Data

(60) Provisional application No. 61/659,701, filed on Jun. 14, 2012, provisional application No. 61/659,834, filed on Jun. 14, 2012.

(51) Int. Cl.
*H03F 3/21* (2006.01)
*H03F 1/52* (2006.01)
(Continued)

(52) U.S. Cl.
CPC .............. *H03F 3/21* (2013.01); *H01L 23/552* (2013.01); *H01L 23/66* (2013.01); *H01L 25/16* (2013.01); *H01L 27/0605* (2013.01); *H01L 27/0658* (2013.01); *H01L 29/7371* (2013.01); *H01L 29/8605* (2013.01); *H03F 1/302* (2013.01); *H03F 3/191* (2013.01); *H03F 3/211* (2013.01); *H04B 1/3827* (2013.01); *H01L 21/8252* (2013.01); *H01L 2223/665* (2013.01); *H01L 2223/6611* (2013.01);
(Continued)

(58) Field of Classification Search
USPC .................. 330/289, 285, 296, 256, 266, 272
See application file for complete search history.

(56) References Cited

U.S. PATENT DOCUMENTS

| | | | |
|---|---|---|---|
| 5,266,819 A | 11/1993 | Chang et al. | |
| 5,378,922 A | 1/1995 | Sovero | |

(Continued)

FOREIGN PATENT DOCUMENTS

| | | | |
|---|---|---|---|
| JP | 2000-124358 A | 4/2000 | |
| JP | 2006-180151 A | 7/2006 | |

OTHER PUBLICATIONS

International Search Report and Written Opinion in PCT/US2013/045720, mailed on Aug. 28, 2013.
(Continued)

*Primary Examiner* — Hieu Nguyen
(74) *Attorney, Agent, or Firm* — Knobbe, Martens, Olson & Bear, LLP

(57) ABSTRACT

The present disclosure relates to a system for biasing a power amplifier. The system can include a first die that includes a power amplifier circuit and a passive component having an electrical property that depends on one or more conditions of the first die. Further, the system can include a second die including a bias signal generating circuit that is configured to generate a bias signal based at least in part on measurement of the electrical property of the passive component of the first die.

18 Claims, 22 Drawing Sheets

(51) Int. Cl.
   *H04B 1/3827* (2015.01)
   *H01L 23/66* (2006.01)
   *H03F 1/30* (2006.01)
   *H03F 3/191* (2006.01)
   *H01L 23/552* (2006.01)
   *H01L 25/16* (2006.01)
   *H01L 27/06* (2006.01)
   *H01L 29/737* (2006.01)
   *H01L 29/8605* (2006.01)
   *H01L 21/8252* (2006.01)

(52) U.S. Cl.
   CPC ........... *H01L 2224/48091* (2013.01); *H01L 2224/48227* (2013.01); *H01L 2924/1305* (2013.01); *H01L 2924/19107* (2013.01); *H01L 2924/3025* (2013.01); *H03F 2200/18* (2013.01); *H03F 2200/318* (2013.01); *H03F 2200/411* (2013.01)

(56) References Cited

U.S. PATENT DOCUMENTS

| | | | |
|---|---|---|---|
| 5,878,335 A | 3/1999 | Kushner | |
| 6,075,995 A | 6/2000 | Jensen | |
| 6,194,968 B1 * | 2/2001 | Winslow | 330/289 |
| 6,236,071 B1 | 5/2001 | Finlay | |
| 6,275,687 B1 | 8/2001 | Lloyd | |
| 6,459,104 B1 | 10/2002 | Schuegraf | |
| 6,559,517 B2 | 5/2003 | Zhu | |
| 6,563,145 B1 | 5/2003 | Chang et al. | |
| 6,573,599 B1 | 6/2003 | Burton et al. | |
| 6,586,782 B1 | 7/2003 | Finlay | |
| 6,627,925 B1 | 9/2003 | Finlay | |
| 6,656,809 B2 | 12/2003 | Greenberg et al. | |
| 6,678,513 B2 | 1/2004 | Glasbrener et al. | |
| 6,787,427 B2 | 9/2004 | Greenberg et al. | |
| 6,797,995 B2 | 9/2004 | Pierson, Jr. et al. | |
| 6,797,996 B1 | 9/2004 | Hikita et al. | |
| 6,800,531 B2 | 10/2004 | Pierson, Jr. et al. | |
| 6,850,746 B1 | 2/2005 | Lloyd et al. | |
| 6,855,992 B2 | 2/2005 | Emrick et al. | |
| 6,858,522 B1 | 2/2005 | Burton et al. | |
| 6,858,887 B1 | 2/2005 | Li et al. | |
| 6,906,359 B2 | 6/2005 | Zampardi et al. | |
| 6,949,776 B2 | 9/2005 | Pierson, Jr. et al. | |
| 6,958,491 B1 | 10/2005 | Brar et al. | |
| 7,333,778 B2 * | 2/2008 | Pehlke et al. | 455/114.3 |
| 7,514,727 B2 | 4/2009 | Asano | |
| 7,563,713 B2 | 7/2009 | Rowell et al. | |
| 7,723,824 B2 | 5/2010 | Guarin et al. | |
| 7,728,357 B2 | 6/2010 | Murayama et al. | |
| 7,755,107 B2 | 7/2010 | Zampardi et al. | |
| 7,948,317 B2 * | 5/2011 | Wan | H03F 1/302 330/277 |
| 8,026,555 B2 | 9/2011 | Zampardi et al. | |
| 8,154,345 B2 * | 4/2012 | Andrys | H03F 1/0261 330/279 |
| 8,159,048 B2 | 4/2012 | Apel et al. | |
| 8,188,575 B2 | 5/2012 | Riege et al. | |
| 8,357,263 B2 | 1/2013 | Berkoh et al. | |
| 8,415,770 B2 | 4/2013 | Riege et al. | |
| 8,415,805 B2 | 4/2013 | Shen | |
| 8,542,061 B2 | 9/2013 | Levesque et al. | |
| 8,559,898 B2 | 10/2013 | Jones et al. | |
| 8,565,694 B2 | 10/2013 | Jones et al. | |
| 8,571,492 B2 | 10/2013 | Berchtold et al. | |
| 9,041,472 B2 | 5/2015 | Chen et al. | |
| 2005/0077964 A1 | 4/2005 | Maeda | |
| 2005/0280471 A1 * | 12/2005 | Matsushita et al. | 330/289 |
| 2006/0226911 A1 | 10/2006 | Kao et al. | |
| 2008/0218270 A1 | 9/2008 | Hau et al. | |
| 2015/0326182 A1 | 11/2015 | Chen et al. | |

OTHER PUBLICATIONS

US 8,489,048, 07/2013, Arkiszewski et al. (withdrawn)

* cited by examiner

PROCESS-COMPENSATED HBT POWER AMPLIFIER BIAS CIRCUITS AND METHODS

RELATED APPLICATIONS

This disclosure claims priority to U.S. Provisional Application No. 61/659,701 filed Jun. 14, 2012 and entitled "PROCESS-COMPENSATED HBT POWER AMPLIFIER BIAS CIRCUITS AND METHODS", and to U.S. Provisional Application No. 61/659,834 filed Jun. 14, 2012 and entitled "RF POWER AMPLIFIERS HAVING SEMICONDUCTOR RESISTORS," the disclosures of which are expressly incorporated by reference herein in their entirety.

TECHNICAL FIELD

The present disclosure relates generally to power amplifiers. More specifically, the present disclosure relates to heterojunction bipolar transistor (HBT) power amplifier bias circuits.

BACKGROUND

Power amplifiers are typically active elements that can magnify an input signal to yield an output signal that is significantly larger than the input signal. Many types of power amplifiers exist and there are many ways to create power amplifiers. For example, some power amplifiers can be created using heterojunction bipolar transistors (HBT).

Many HBT power amplifiers use a diode stack bias configuration. In some such configurations, the diode stack bias configuration exhibits sensitivity to the device beta, which can result in substantial quiescent current variation of the amplifier. Further, the variation of quiescent current may impact performance parameters and may degrade product yield.

SUMMARY

In accordance with some embodiments, the present disclosure relates to a system for biasing a power amplifier. The system can include a first die that includes a power amplifier circuit and a passive component having an electrical property that depends on one or more conditions of the first die. Further, the system can include a second die including a bias signal generating circuit that is configured to generate a bias signal based at least in part on measurement of the electrical property of the passive component of the first die.

In some cases, the first die includes a heterojunction bipolar transistor (HBT) die, and the second die includes a silicon die. Further, the passive component may include a resistor formed from a portion of the HBT die. In addition, the electrical property of the passive component may include an electrical resistance.

For some embodiments, the resistor is formed from a base material of the HBT die. Further, the one or more conditions of the first die may include the temperature of the HBT die. In addition, the resistor may have a resistance value that is approximately proportional to the temperature of the first die. In some embodiments, the one or more conditions may include process variation of the HBT die. Alternatively, or in addition, the one or more conditions may include a beta parameter associated with the HBT die.

Moreover, in some cases, the bias signal generating circuit includes a V-I circuit configured to provide a reference current to the resistor. The reference current may have a value that depends on the resistance of the resistor. Additionally, in some cases, the V-I circuit provides the reference current based on a PTAT reference voltage that is substantially independent of the one or more conditions of the first die. Furthermore, in some cases, the V-I circuit is further configured to generate the bias signal based on the reference current drawn by the resistor.

Certain embodiments described herein relate to a power amplifier module. The power amplifier module can include a packaging substrate configured to receive a plurality of components. In addition, the power amplifier module can include a first die mounted on the packaging substrate. The first die may include a power amplifier circuit and a passive component having an electrical property that depends on one or more conditions of the first die. Furthermore, the power amplifier may include a second die mounted on the packaging substrate and interconnected with the first die. The second die may include a bias signal generating circuit that is configured to generate a bias signal based at least in part on measurement of the electrical property of the passive component of the first die.

In some instances, the first die includes a III-V semiconductor die mounted on the packaging substrate. Further, the first die may include an HBT having a selected layer above a sub-collector layer. The first die can further include a semiconductor resistor having a resistive layer disposed laterally from, and electrically isolated from the selected layer. The resistive layer and the selected layer may be formed from substantially the same material. Moreover, the passive component may include the semiconductor resistor.

In some embodiments, the selected layer includes a base layer. Further, in some cases, the selected layer includes a sub-collector layer. The semiconductor resistor may further include electrical contact pads disposed on the resistive layer to yield a resistance value for the semiconductor resistor. In some instances, the semiconductor resistor is connected to a circuit located outside of the first die. Further, the semiconductor resistor may be configured to be sensitive to a change in one or more conditions associated with the selected layer of the HBT.

Additional embodiments described herein relate a wireless device. The wireless device can include a transceiver configured to process RF signals. Further, the wireless device may include an antenna in communication with the transceiver configured to facilitate transmission of an amplified RF signal. In addition, the wireless device may include a power amplifier disposed on a first die and connected to the transceiver and configured to generate the amplified RF signal. The first die may include a passive component having an electrical property that depends on one or more conditions of the first die. Moreover, the wireless device may include a bias circuit disposed on a second die and interconnected to the power amplifier. The bias circuit may be configured to generate a bias signal for the power amplifier based at least in part on measurement of the electrical property of the passive component of the first die.

Some embodiments described herein relate to a semiconductor die. The semiconductor die may include a substrate configured to receive a plurality of components. Further, the semiconductor die may include a heterojunction bipolar transistor (HBT) disposed on the substrate. The HBT can include a base formed from base material. Further, the semiconductor die can include a resistor disposed on the substrate and formed from the base material. In some embodiments, resistivity of the base material depends on at least one condition of the HBT. In addition, the semiconductor die can include electrical contacts formed on the resistor so that resistance between the electrical contacts substantially tracks the at least one condition of the HBT.

In accordance with some embodiments, the present disclosure relates to a III-V semiconductor die. The III-V semiconductor die may include a substrate and an HBT formed on the substrate. Further, the HBT may include a selected layer above a sub-collector layer. In addition, the III-V semiconductor die may include a semiconductor resistor disposed over the substrate. The semiconductor resistor may include a resistive layer disposed laterally from, and electrically isolated from the selected layer. The resistive layer and the selected layer may be formed from substantially the same material.

In some cases, the substrate includes GaAs. Further, the selected layer may include an emitter layer. Moreover, the selected layer may include a base layer. In some cases, the selected layer may include an ion-implanted base layer.

In certain embodiments, the semiconductor resistor is connected to the HBT. Further, the semiconductor resistor may be configured to provide ballast resistance for the HBT. In some cases, the semiconductor resistor is connected to a circuit located outside of the die. Moreover, the semiconductor resistor may be configured to be sensitive to a change in one or more conditions associated with the selected layer of the HBT.

For some cases, the semiconductor resistor further includes electrical contact pads disposed on the resistive layer to yield a resistance value for the semiconductor resistor. In some instances, the selected layer and the resistive layer are formed during the same processing step. Further, in some cases, layer structures underneath the selected layer and the resistive layer are substantially the same. In addition, in some embodiments, the die is substantially free of thin-film resistors.

Some embodiments described herein relate to a III-V semiconductor die. The III-V semiconductor die may include a substrate and a stack structure formed on the substrate. The stack structure may include a selected layer. Further, the III-V semiconductor die may include a semiconductor resistor disposed over the substrate. The semiconductor resistor may include a resistive layer disposed laterally from, and electrically isolated from the stack structure. Further, the resistive layer and the selected layer may be formed from substantially the same material.

In some embodiments, the III-V semiconductor die also includes an electrical contact pad disposed on the resistive layer and configured for an external connection of the semiconductor resistor. Further, the stack structure may include an HBT. In some cases, the selected layer includes a base layer. Further, in some cases, the selected layer includes a sub-collector layer.

Certain embodiments described herein relate to a power amplifier module. The power amplifier module may include a packaging substrate configured to receive a plurality of components. Further, the power amplifier module may include a III-V semiconductor die mounted on the packaging substrate. In some cases, the die includes an HBT having a selected layer above a sub-collector layer. The die may further include a semiconductor resistor having a resistive layer disposed laterally from, and electrically isolated from the selected layer. In addition, the resistive layer and the selected layer may be formed from substantially the same material.

Some embodiments described herein relate to a wireless device. The wireless device may include a transceiver configured to process RF signals. Further, the wireless device may include an antenna in communication with the transceiver configured to facilitate transmission of an amplified RF signal. In addition, the wireless device may include a power amplifier disposed on a III-V semiconductor die and connected to the transceiver and configured to generate the amplified RF signal. The die may further include an HBT having a selected layer above a sub-collector layer. In addition, the die may include a semiconductor resistor having a resistive layer disposed laterally from, and electrically isolated from the selected layer. Further, the resistive layer and the selected layer may be formed from substantially the same material.

BRIEF DESCRIPTION OF THE DRAWINGS

Throughout the drawings, reference numbers are re-used to indicate correspondence between referenced elements. The drawings are provided to illustrate embodiments of the inventive subject matter described herein and not to limit the scope thereof.

FIGS. 17A-1-17G-1 are electrical schematic diagrams of the semiconductor resistors of FIGS. 17A-17G, respectively.

DESCRIPTION

The headings provided herein, if any, are for convenience only and do not necessarily affect the scope or meaning of the claimed invention.

Figure 1:
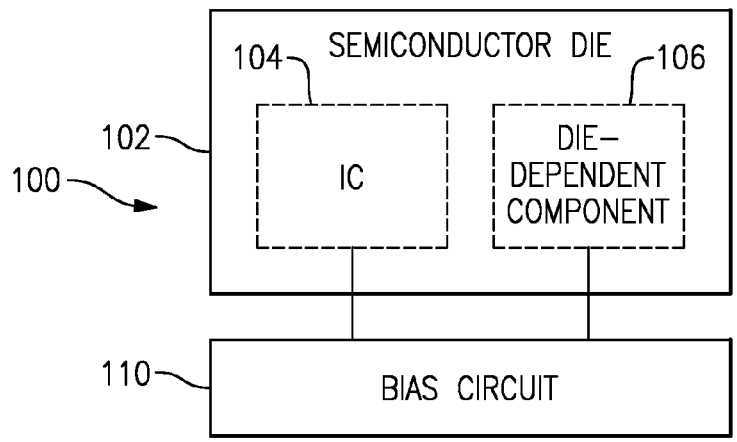
FIG. 1 illustrates an embodiment of a radio-frequency (RF) configuration that includes an integrated circuit (IC) formed on a semiconductor die.

FIG. 1 shows a radio-frequency (RF) configuration 100 that includes an integrated circuit (IC) 104 formed on a semiconductor die 102. Operation of at least a portion of the IC 104 can be facilitated by a bias circuit 110 that is located outside of the die 102. In some implementations as described herein, the die 102 can include a die-dependent component 106 having one or more operating parameters that depends on one or more conditions associated with the die 102. Non-limiting examples of such a die-dependent component is described herein in greater detail.

As further shown in FIG. 1, the die-dependent component 106 can be coupled to the bias circuit 110 so that the bias circuit 110 can be operated based at least in part based on a condition of the die-dependent component 106. Because such a condition of the die-dependent component 106 is representative of a condition of the die 102, operating the bias circuit in the foregoing manner can allow the IC 104 to be operated in an improved manner. Various examples of such die-dependent operation are described herein in greater detail.

Figure 2:
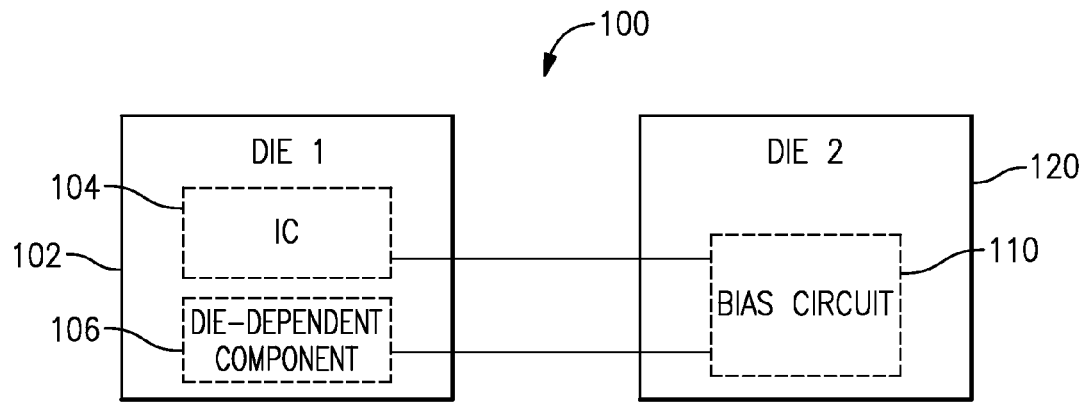
FIG. 2 illustrates an embodiment of the RF configuration with the IC and the die-dependent component of FIG. 1 formed on a first semiconductor die, and the bias circuit of FIG. 1 formed on a second semiconductor die.

FIG. 2 shows that in some implementations, the IC 102 and the die-dependent component 106 of FIG. 1 can be formed on a first semiconductor die 102, and the bias circuit 110 (of FIG. 1) can be formed on a second semiconductor die 120. Examples of the types of the first and second dies 102, 120 are described herein in greater detail.

Figure 3:
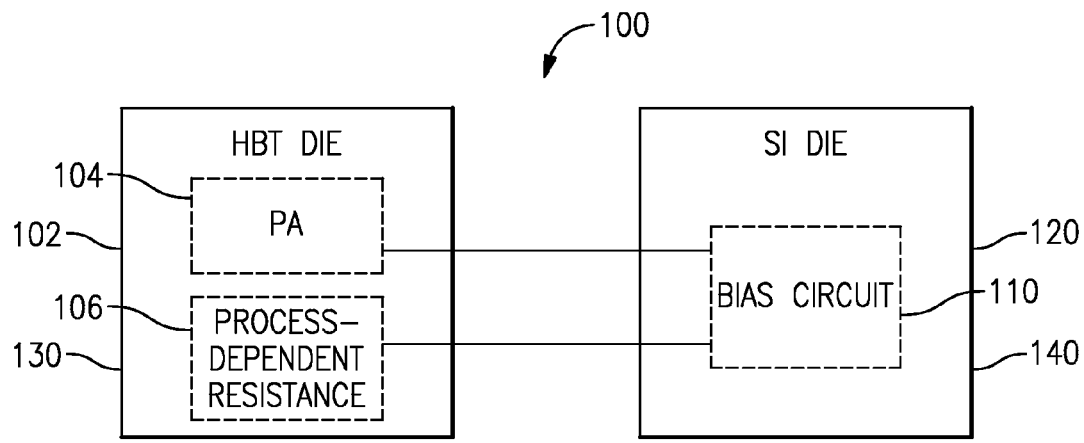
FIG. 3 illustrates another embodiment of the RF configuration illustrated in FIG. 2.

FIG. 3 shows an example of the two separate dies 102, 120 of FIG. 2. The first die 102 can be a die 130 based on heterojunction bipolar transistor (HBT) process technology. As further shown in FIG. 3, the IC formed on such a die can include a power amplifier (PA) circuit 104. As further shown in FIG. 3, the process-dependent component can include a component 106 having a process-dependent resistance.

FIG. 3 further shows that the second die 120 can be a die 140 based on silicon process technology. The bias circuit 110 is shown to be formed on such a die. Although various examples are described herein in the context of HBT and silicon dies, it will be understood that one or more features of the present disclosure can also be applied in other combinations of types of dies. It will also be understood that, although described in the context of PA operation and biasing of such a PA, one or more features of the present disclosure can also be applied to other types of ICs and control of such ICs.

In the context of an HBT-based PA die and a bias circuit on a separate silicon die, a standard "diode stack" bias configuration used in many linear HBT power amplifier designs typically exhibits sensitivity to the device beta resulting in significant quiescent current variation of the amplifier. Variation of quiescent current can impact performance parameters such as gain, linearity and current drain. Product yield can also be degraded due to variation of these parameters.

Inability or reduction in capability in handling such beta sensitivity can result in operating configuration that requires increased biasing of the reference circuitry, which typically increases current drain for the product. In some situations, more complex circuit designs can be applied to the diode-stack biasing approach, which typically increase circuit area and current drain. Alternate bias approaches can be used other than the diode-stack topology; however, but these approaches can often compromise bandwidth, degrade noise, and/or require external passive components.

Figure 4:
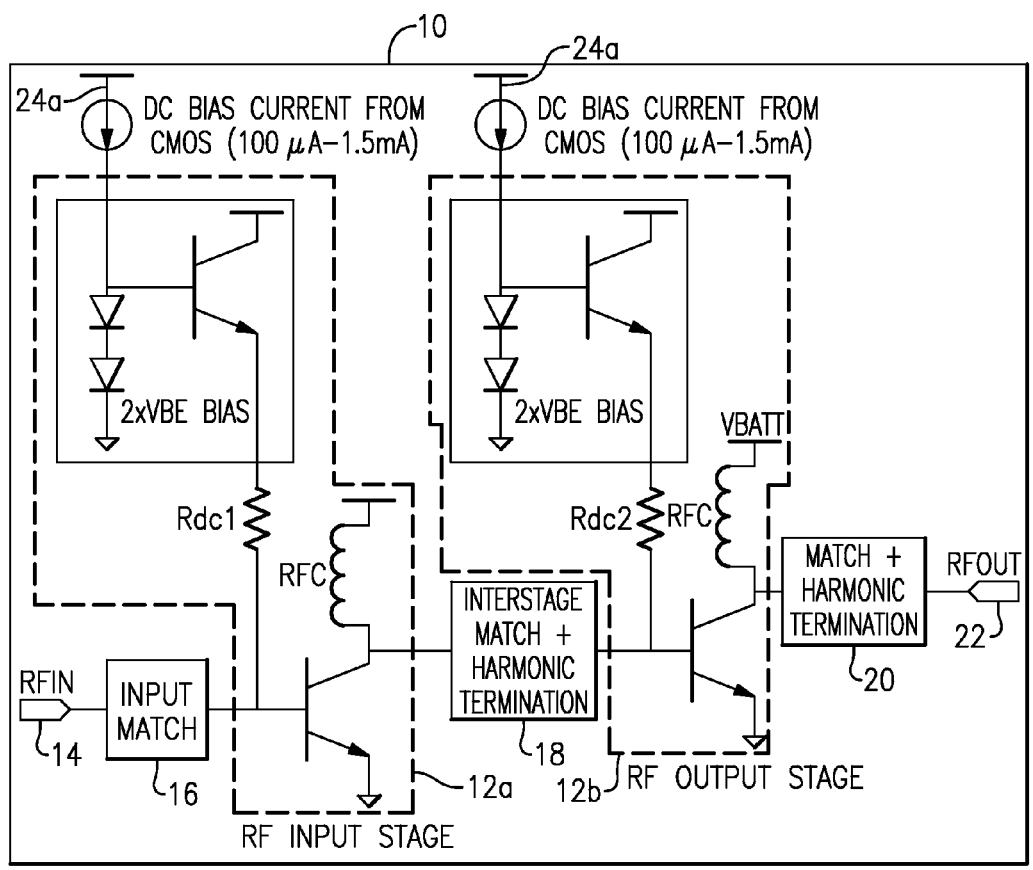
FIG. 4 illustrates an embodiment of a linear HBT PA die having a standard "diode stack" bias configuration.

FIG. 4 shows an example linear HBT PA die 10 having the foregoing standard "diode stack" bias configuration. For the purpose of description, the example PA die 10 is shown to include two stages 12a, 12b. It will be understood that the number of stages can be more or less than two. The first stage 12a is shown to receive an RF signal to be amplified from an RFIN node 14 through an input match circuit 16. An output of the first stage 12a is shown to be passed to the second stage 12b via an interstage circuit 18 that provides matching and harmonic termination. An output of the second stage 12b is shown to be passed to an RFOUT node 22 via an output match and harmonic-termination circuit 20.

In the example shown in FIG. 4, each PA stage is shown to receive DC bias current from a CMOS bias circuit (not shown) through an input 24a. The bias current is shown to be provided to a 2×Vbe diode mirror having a diode stack to yield a bias signal. Such a design topology demonstrates sensitivity to process beta which can result in increased part-to-part variation of quiescent current impacting gain, efficiency and linearity.

In some implementations, the present disclosure relates to a PA configuration that takes advantage of a passive device on the amplifier die to effectively sense die-dependent parameter such as beta and compensate for the associated effects such as quiescent-current variation to improve performance and/or reduce the part-to-part variation of the product. In some embodiments, such a PA configuration can include a silicon bias die and an HBT amplifier die. Traditionally, the silicon die would generate a reference current for the PA die which is substantially constant with respect to temperature of the PA die and essentially only varies by the tolerance of a discrete resistor.

In some implementation of the present disclosure, such a discrete reference resistor can be replaced by an integrated resistor on the HBT die. In some embodiments, this integrated resistor can be formed with the HBT device base material, and can exhibit a sheet resistance characteristic which tracks with the process beta. Based on such resistance, a reference current can be configured to track with beta and cancel or reduce the "diode-stack" sensitivity to beta.

In some embodiments, the foregoing base resistor (Rb) type can be configured to yield a high temperature coefficient which can be compensated by the bias generation circuitry within the silicon control die such that the voltage applied across the reference resistor increases with the ambient temperature. The resulting reference current sourced to the amplifier can be substantially constant over a selected range of ambient temperature and substantially track the HBT process beta.

Figure 5:
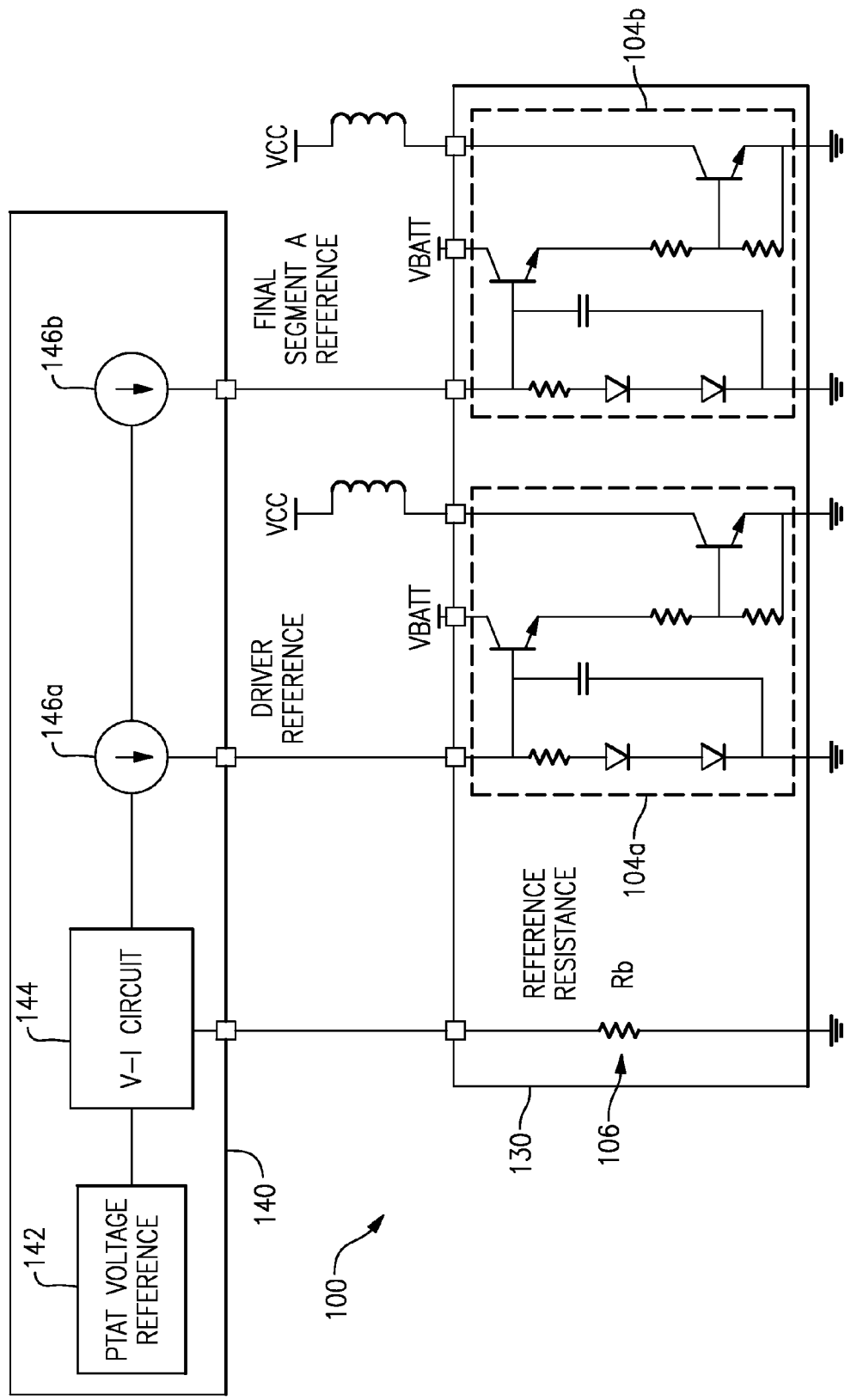
FIG. 5 illustrates another embodiment of a RF configuration where an HBT PA die includes a resistor whose resistance Rb is process-dependent.

FIG. 5 shows an example configuration 100 where an HBT PA die 130 includes a resistor 106 whose resistance Rb is process-dependent. Such a resistor can be used as a reference resistance for generating bias signals for the two example PA stages 104a, 104b. It will be understood that one or more features associated with the reference resistance and generation of bias signals based on such a reference resistance can be applied to PA configurations having more or less number of stages.

In the example configuration 100, one end of the reference resistor 106 is shown to be connected to a V-I circuit 144; and the other end is shown to be connected to a ground. The V-I circuit 144 is depicted as being on a silicon die 140, and is shown to facilitate current sources 146a, 146b providing bias signals for the first and second stages 104a, 104b. As described herein, such bias signals can be compensated for variations in one or more conditions of the HBT PA die 130. An example of how the V-I circuit 144 can be configured and operated in conjunction with a proportional-to-absolute-temperature (PTAT) voltage reference 142 and the reference resistor 106 is described herein in greater detail.

Figure 6:
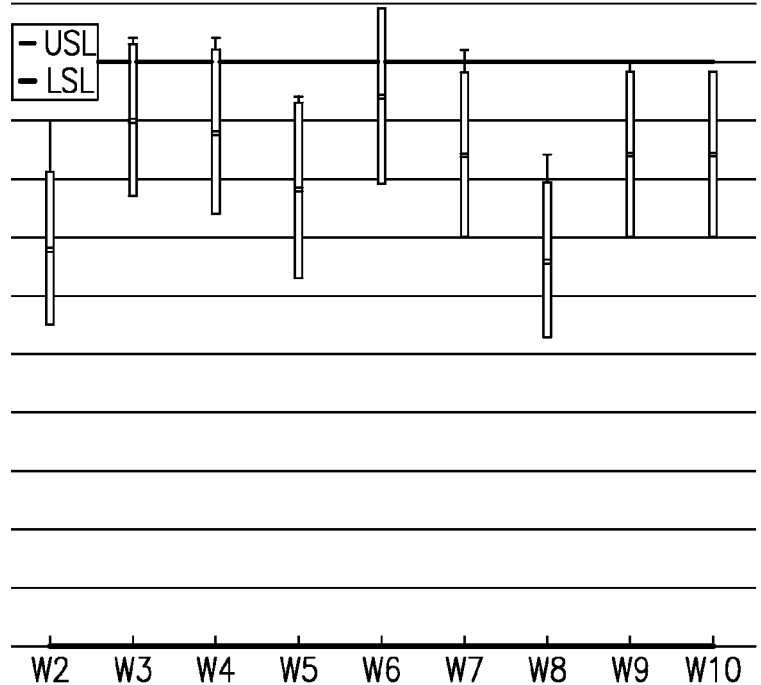
FIG. 6 presents an example graph of 1/Rb values for HBT dies formed on different wafers (W2 to W10).
Figure 7:
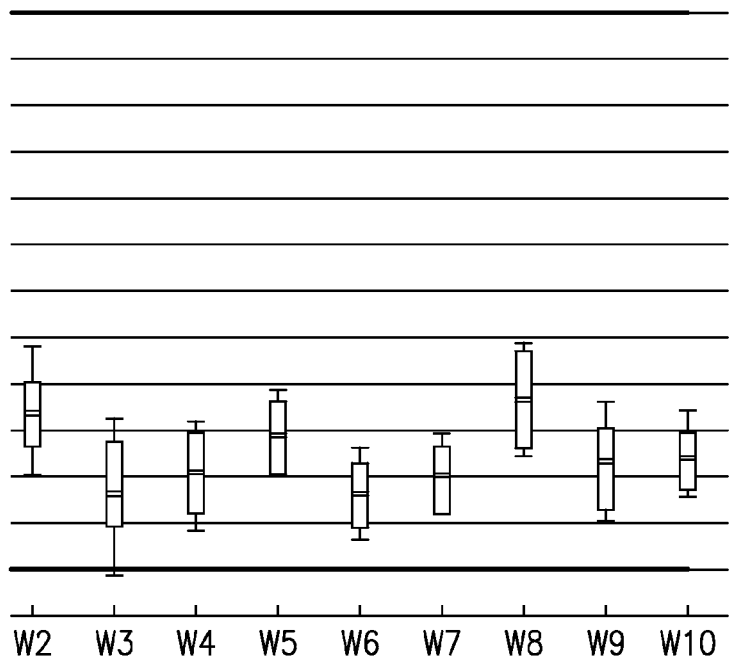
FIG. 7 presents an example graph of beta values for the same HBT dies formed on the example wafers W2-W10.
Figure 8:
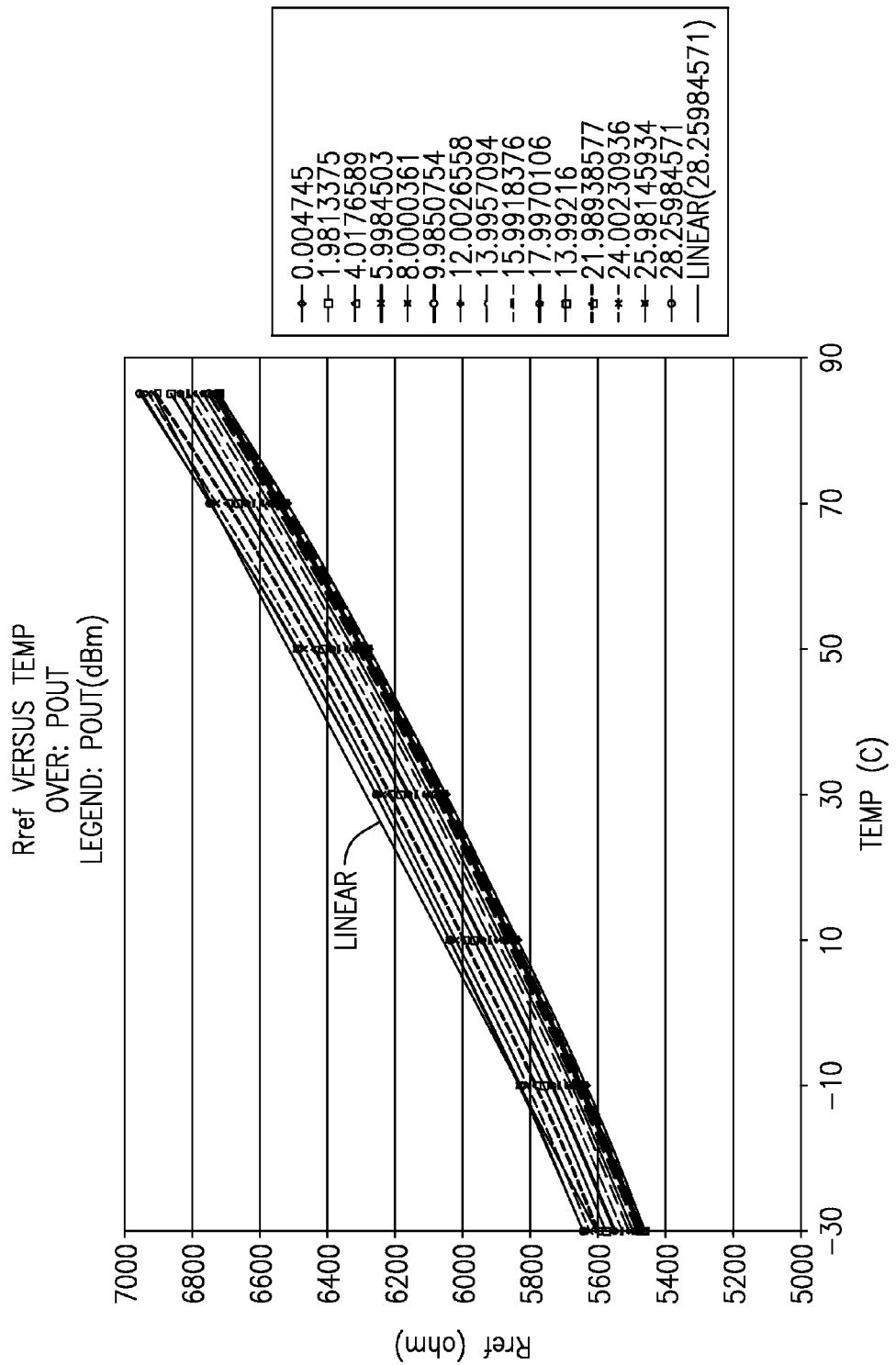
FIG. 8 presents an example graph of reference resistances (Rref) versus operating temperature for different power output settings (in dBM) of an HBT PA.

FIGS. 6-8 show how measurements of resistance (Rref, and also referred to as Rb) associated with the reference resistor 106 can detect variations in beta parameter and temperature. FIG. 6 shows a plot of 1/Rb values for HBT dies formed on different wafers (W2 to W10). FIG. 7 shows a plot of beta values for the same HBT dies formed on the example wafers W2-W10. A number of observations can be made. One can see in FIG. 7 that there can be die-to-die variations in the beta parameter within a given wafer. Between different wafers, there can also be significant variations in the beta parameter. Similarly, one can see in FIG. 6 that there can be significant die-to-die and wafer-to-wafer variations in 1/Rb.

Empirically, one can also see in FIGS. 6 and 7 that the wafer-to-wafer values of 1/Rb are correlated to beta values. For example, a dip in average beta value for wafers W2 to W5 corresponds to a hump in average 1/Rb value for the same wafers. Such a trend of increase/decrease in 1/Rb when beta decreases/increases continues through the example sample of wafers.

While it is not desired or intended to be bound by any particular theory, some theories associated with base resistance Rb and beta parameter can be considered. Base resistance Rb can be expressed as sheet resistance $R_{bsh}$ which in turn can be expressed as $$R_{bsh} = 1/(q\mu_p N_A w_b) \quad (1)$$

where q is the carrier charge, $\mu_n$, is the n-type carrier mobility, $N_A$ is the net impurity concentration, and $w_b$ is the base layer thickness. The beta parameter can be expressed as DC current gain $$\beta_{max} = (N_E/N_B)(v_{nB}/v_{pE})e^{[\Delta E_v/(kT)]} = (N_E/N_B)(D_n/D_p)(w_E/w_B)e^{[\Delta E_v/(kT)]} \quad (2A)$$

for AlGaAs and Si, where $N_E$ and $N_B$ are the emitter and base doping concentrations, $w_E$ and $w_B$ are the emitter and base thicknesses, and $\Delta E_v$ is the effective valence-band barrier height. In some situations, the DC current gain for InGaP can be expressed as $$\beta = (v_{nB}/w_b)\tau(N_b), \quad (2B)$$

which can be manipulated to show that $$(\beta/R_{bsh}) = qN_E w_E \mu_n e^{[\Delta E_v/(kT)]}. \quad (2C)$$

In Equation 2C, one can see that the parameters on the right side are related to the emitter, and thus may not vary significantly over the base process. Thus, for variations in the base (which is where most of the variation of Rb and β arise for an HBT), the beta parameter β and the base resistance Rb can respond substantially identically or in a similar manner, so that ratio of the two parameters can be generally constant. Accordingly, measurement of variation in Rb can provide information about the variation in β for changes that occur in the base.

FIG. 8 shows plots of reference resistances (Rref) versus operating temperature for different power output settings (in dBM) of an HBT PA. One can see that the relationship between Rref and temperature is approximately linear.

Figure 9:
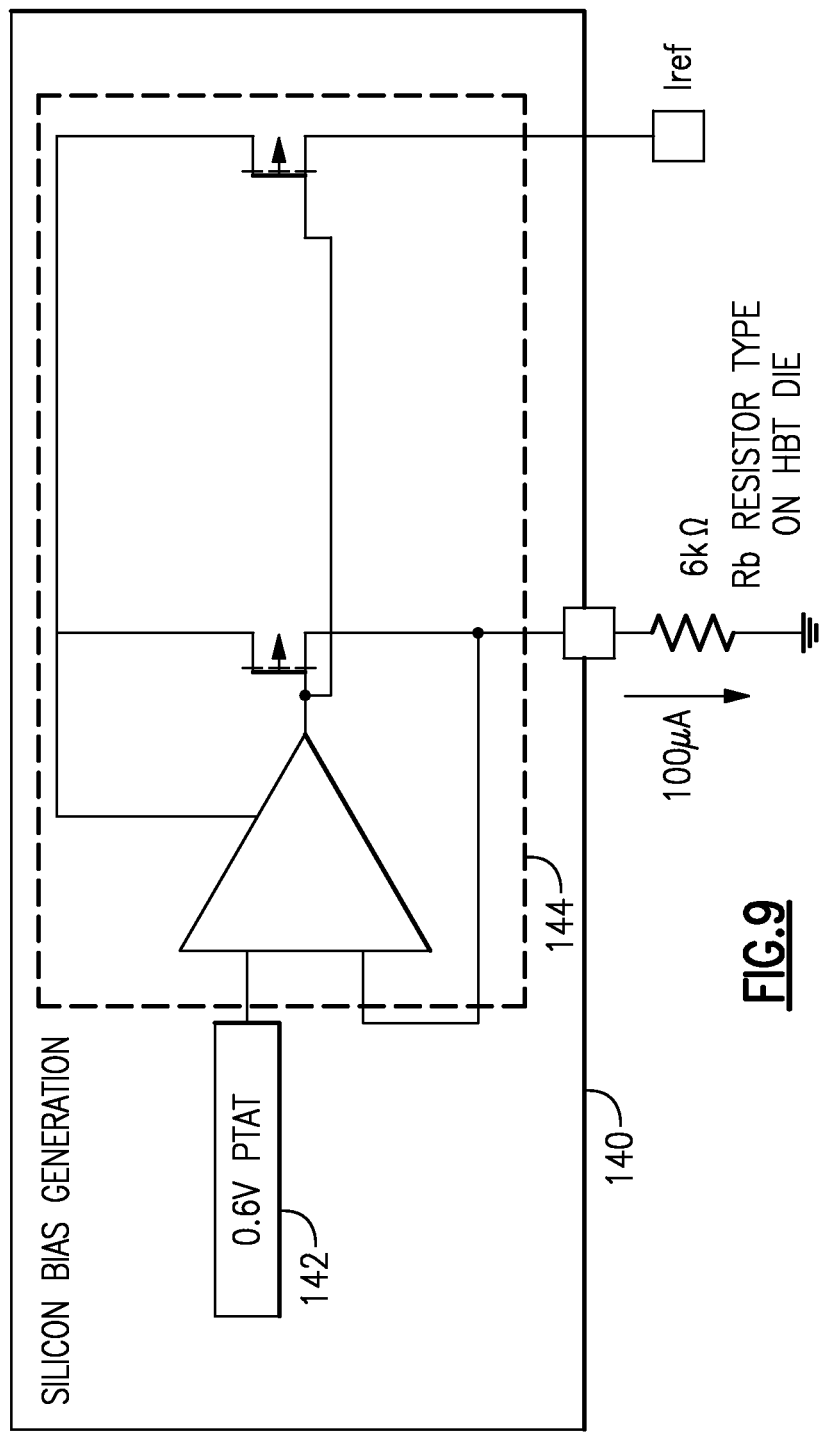
FIG. 9 illustrates an embodiment of a V-I circuit that can generate compensated control signals.

As described in reference to FIGS. 5-8, base resistance of a PA die (e.g., an HBT PA die) can varies with temperature and/or base layer parameters. In some implementations, such resistance can be utilized as a reference resistance to generate a control signal (e.g., a bias signal) that compensates for the variation(s) associated with temperature and/or base layer parameters. FIG. 9 shows an example V-I circuit 144 that can generate such compensated control signals.

The example V-I circuit 144 is shown to be formed on a silicon die 140, and can be configured to receive a proportional to absolute temperature (PTAT) signal (e.g., approximately 0.6V) from a PTAT source 142. Such a signal, generally independent of temperature and process parameters of the HBT PA die, can be provided to the base resistor (106 in FIG. 5). For example, current provided to the base resistor 106 can vary depending on the value of base resistance (Rb). In the example shown, the 0.6 PTAT voltage provided to an example Rb value of 6 kΩ results in approximately 100 μA current being drawn. This current can be used to generate an output voltage from the V-I circuit, to yield a reference current Iref to be provided to the PA circuit form on the HBT die. Such a reference current (Iref) provided to the HBT die is compensated for HBT die related effect(s) sensed by the base resistor 106.

Figure 10:
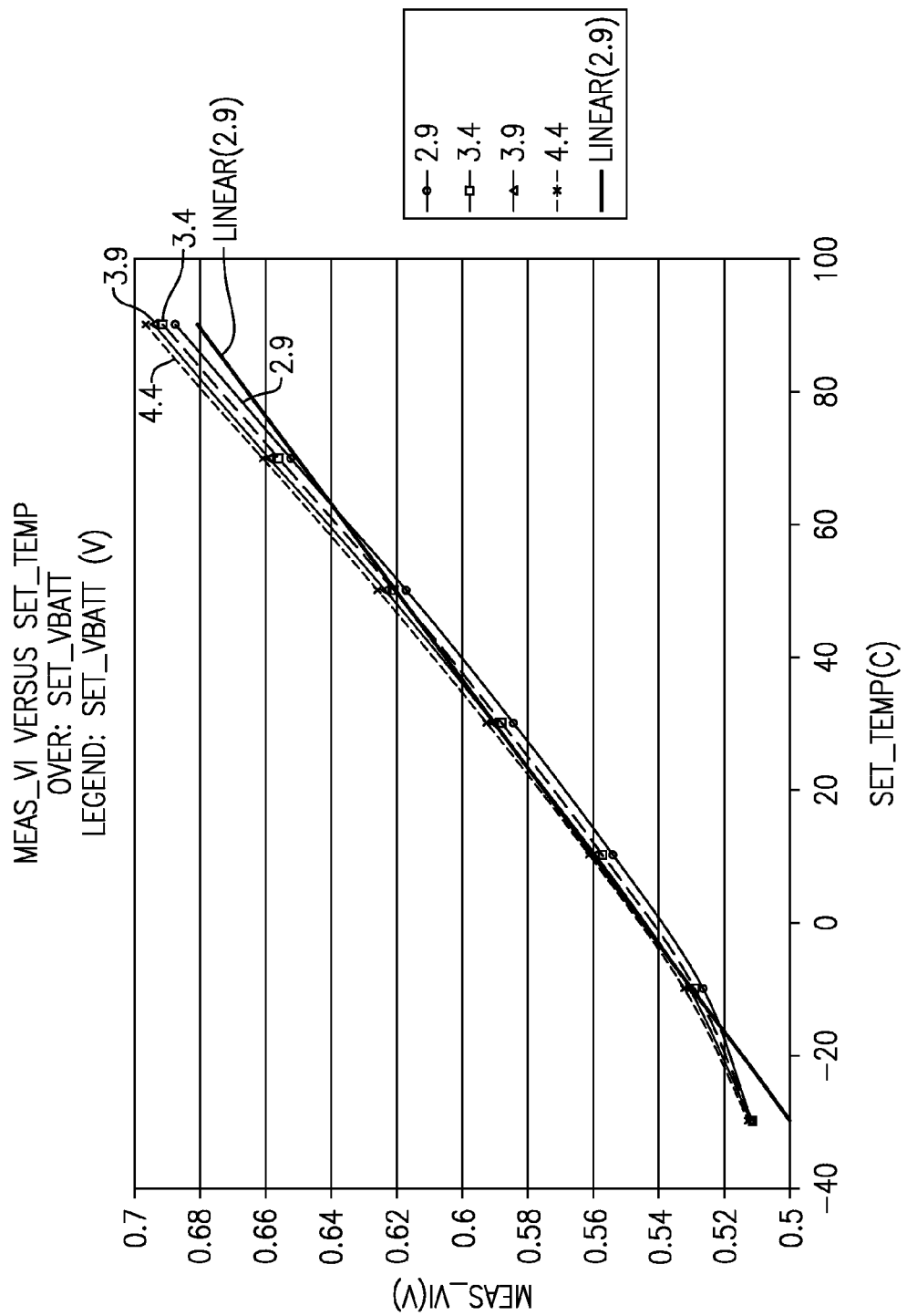
FIG. 10 presents an example graph of measured output voltages from the V-I circuit versus temperatures for different Vbatt settings (2.9V, 3.4V, 3.9V, 4.4V).

FIG. 10 shows plots of measured output voltages from the V-I circuit versus temperatures for different Vbatt settings (2.9V, 3.4V, 3.9V, 4.4V). Similar to the generally linear relationship between reference resistance and temperature, the V-I output voltages are also generally proportional to the base temperature of the HBT PA die.

Examples of benefits that can be realized from one or more features of the present disclosure are described in reference to FIGS. 11-14. To simulate performance of a power amplifier under different conditions, following parameters were varied between nominal values, high values, and low values: beta parameter, turn-on voltage Vbe, Ft parameter, resistance and capacitance. The "uncompensated" design of FIGS. 11A and 11B corresponds to the example configuration of FIG. 4, and the "compensated" design of FIGS. 12A and 12B corresponds to the example configuration of FIG. 5.

Figure 11A:
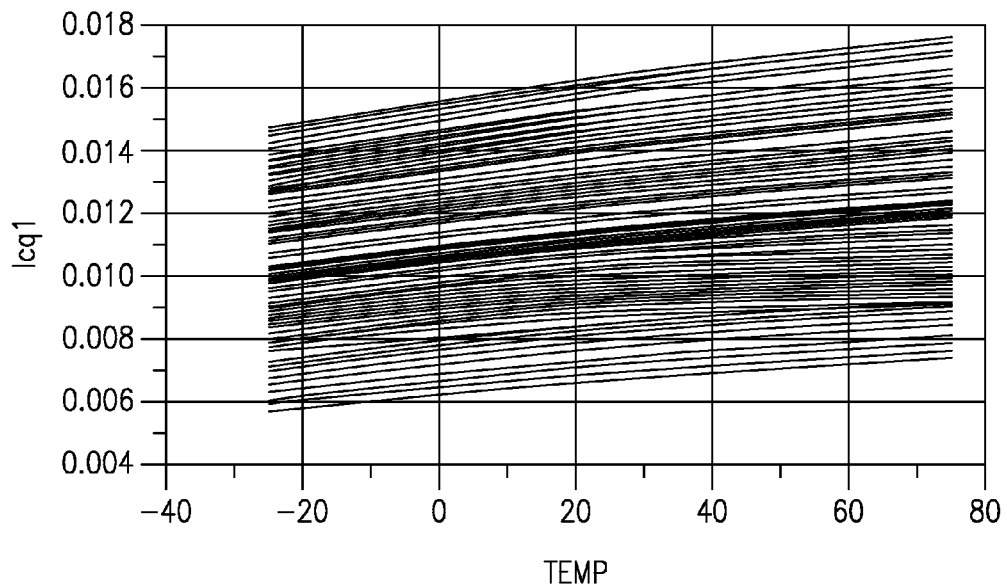
FIGS. 11A and 11B present example graphs of quiescent currents for first and second stages of an uncompensated PA example versus temperature.
Figure 11B:
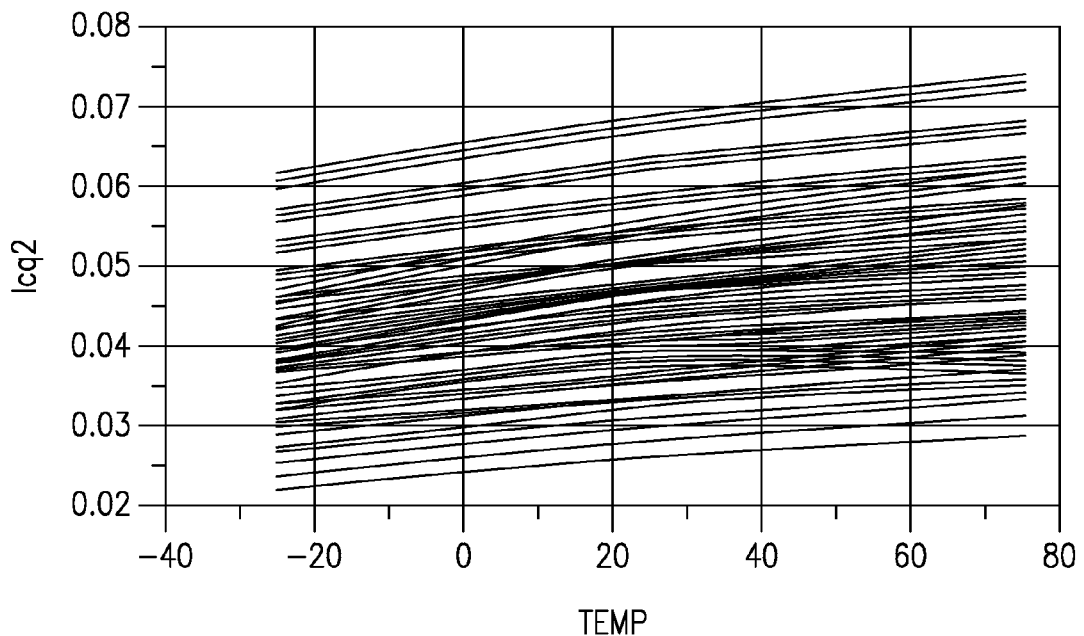

FIGS. 11A and 11B show plots of quiescent currents for first and second stages of the uncompensated PA example described herein versus temperature. The different plots correspond to different combinations of the varied parameters. In each of the first and second stage simulations, the quiescent current varies by about +/−50%.

Figure 12A:
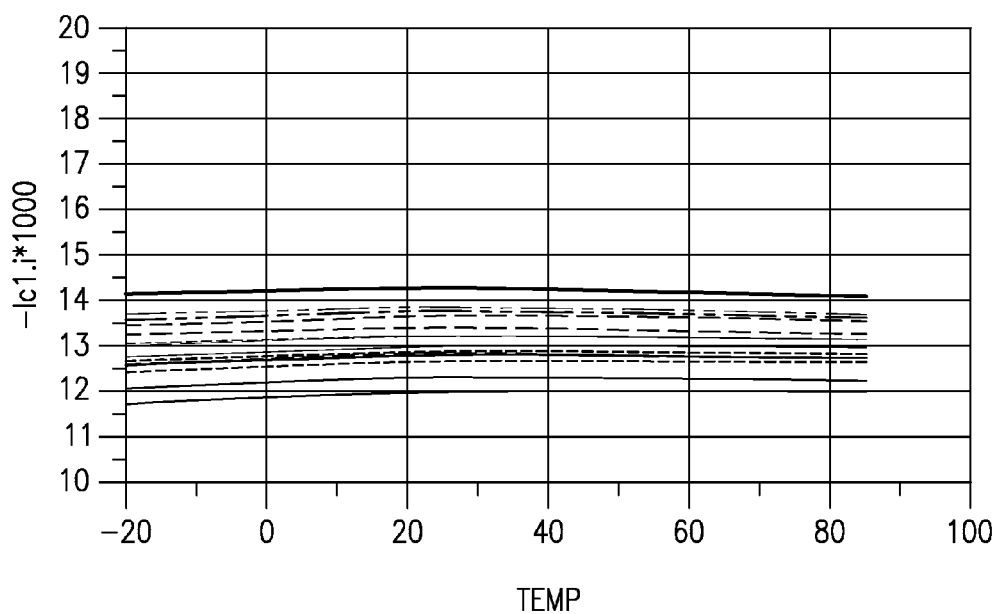
FIGS. 12A and 12B present example graphs of quiescent currents for first and second stages of a compensated PA example versus temperature.
Figure 12B:
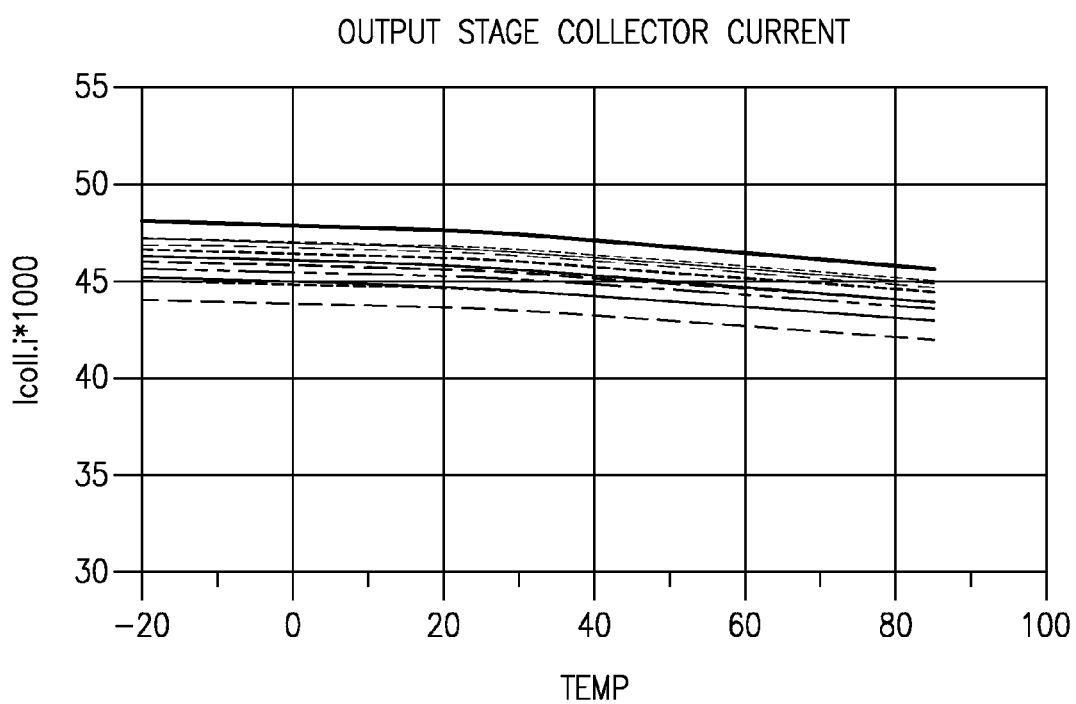

FIGS. 12A and 12B show plots of quiescent currents for first and second stages of the compensated PA example described herein versus temperature. The different plots correspond to different combinations of the varied parameters. For the first stage, the quiescent current varies by about +/−10%. For the second stage, the quiescent current varies by about +/−7%. One can see that for both stages, the relative amount of variation in quiescent current in the compensated configuration is drastically less than that of the uncompensated configuration.

Figure 13:
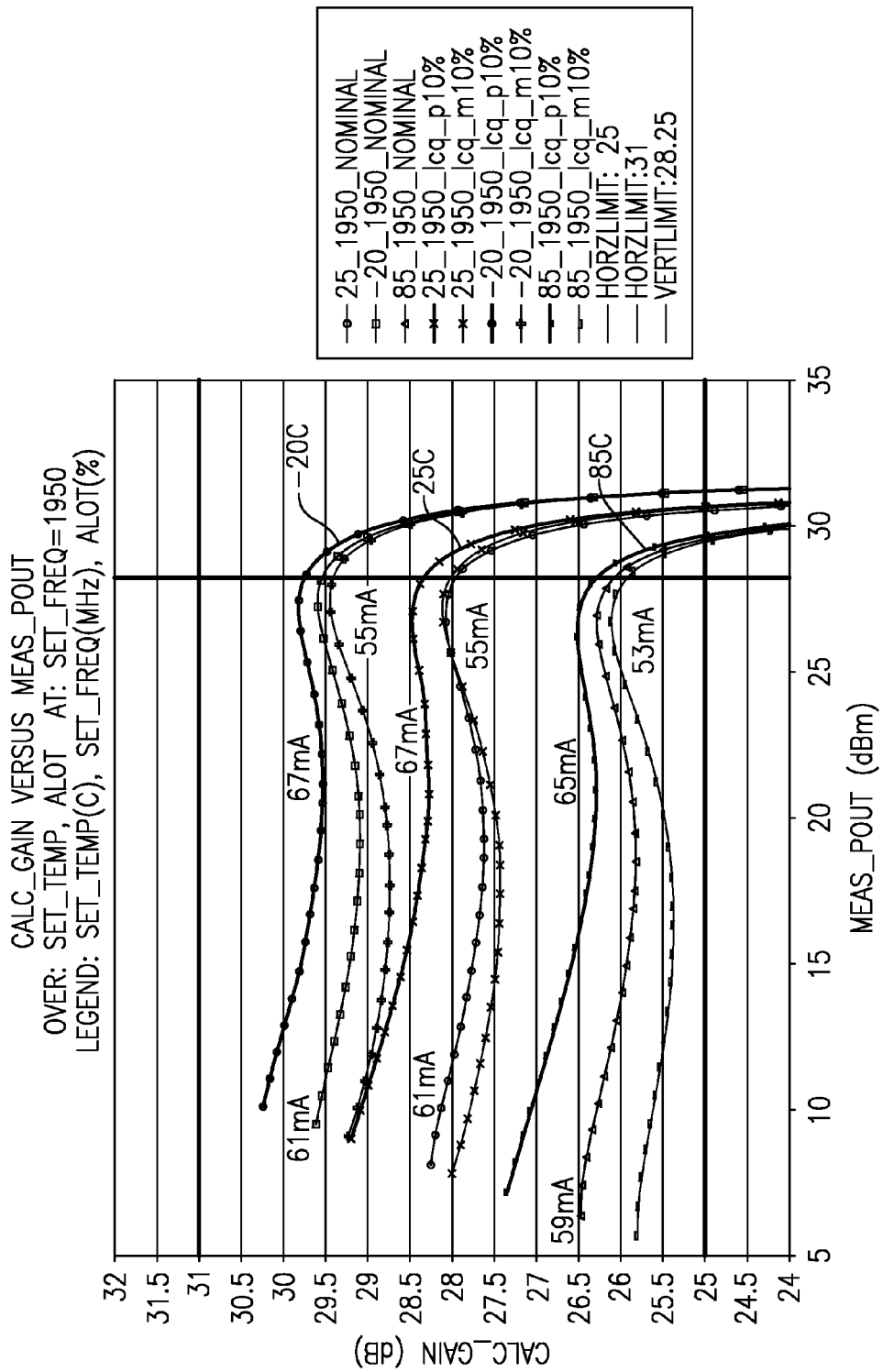
FIG. 13 shows example plots of calculated gain (dB) versus power output (dBm) at three example temperatures (−20° C., 25° C., 85° C.).
Figure 14:
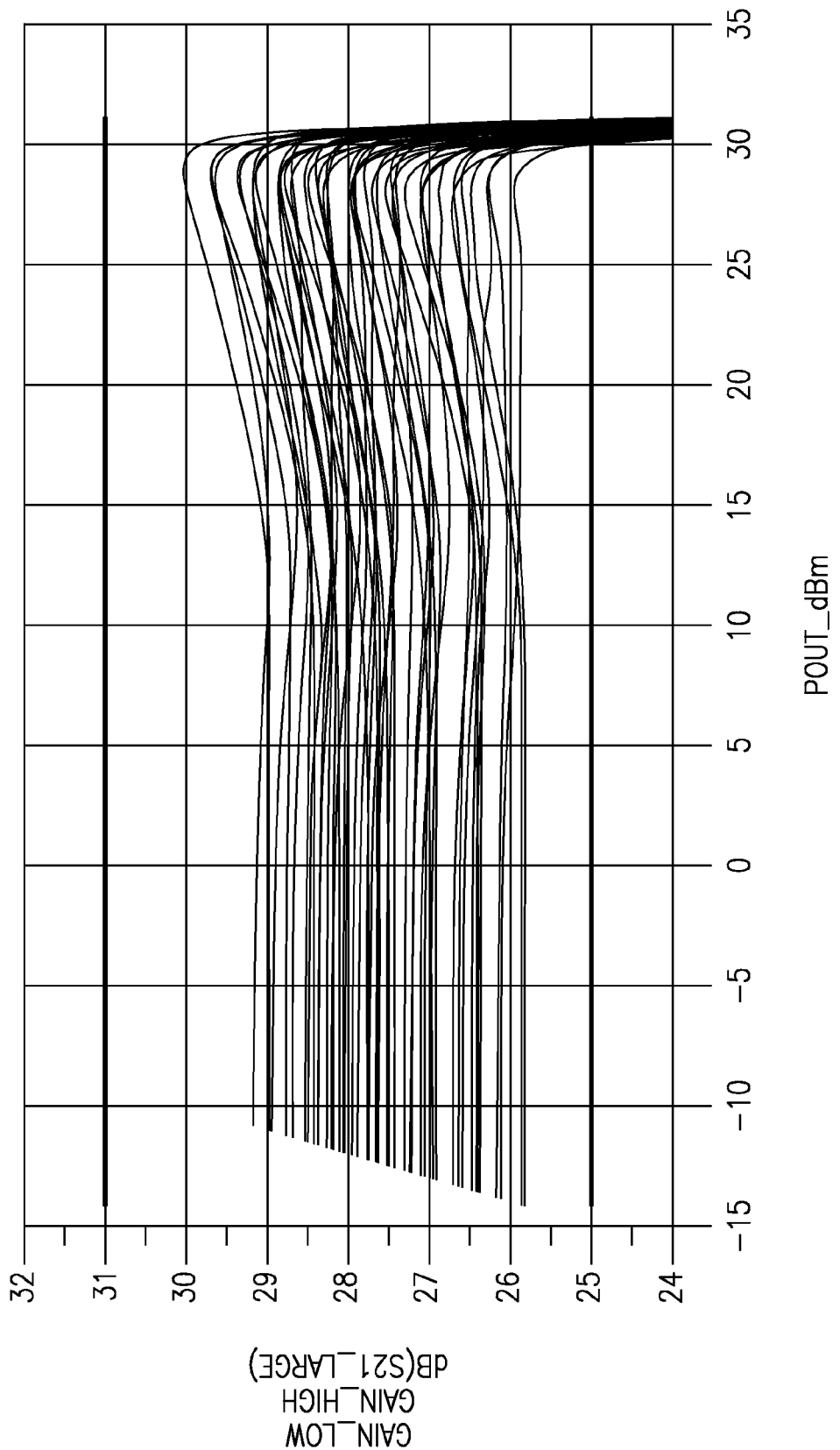
FIG. 14 shows example plots of gains versus power output for the different combinations of the varied parameters described in reference to FIG. 12.

FIGS. 13 and 14 show examples of improvements in gain characteristics that can be provided by the reduced variation of quiescent current. FIG. 13 shows plots of calculated gain (dB) versus power output (dBm) at three example temperatures (−20° C., 25° C., 85° C.). For each temperature, the middle curve corresponds to a nominal configuration; the upper curve corresponds to quiescent current being at plus 10%, and the lower curve corresponds to quiescent current being at minus 10%. It is noted that 10% is the worst-case variation for the compensated configuration described in reference to FIG. 12. One can see that the +/−10% variation in quiescent current is generally constant over temperature; and thus can yield a good compression performance characteristic.

FIG. 14 shows plots of gains versus power output for the different combinations of the varied parameters described in reference to FIG. 12. One can see that all of the compensated gain curves desirably fit within a window of 28 dB+/−3 dB.

In some implementations, a base resistor having one or more features as described herein can be a semiconductor resistor formed on a III-V semiconductor die (e.g., HBT die). Additional details concerning such resistors are described herein with respect to FIGS. 15-21.

Figure 15:
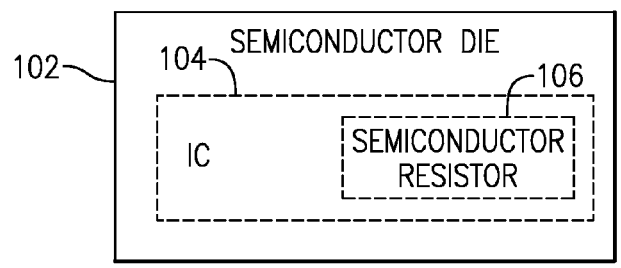
FIG. 15 illustrates an embodiment of a semiconductor die having an integrated circuit (IC).

FIG. 15 schematically shows a semiconductor die 102 having an integrated circuit (IC) 104. In some embodiments, such an IC can include one or more semiconductor resistors 106. Examples of such a semiconductor resistor are described herein in greater detail.

In some implementations, some or all of thin-film (e.g., TaN) resistors associated with a semiconductor die and an IC thereon can be replaced with semiconductor resistors. In some implementations, such semiconductor resistors can be fabricated from one or more of the actual layers that form layer-stack devices such as heterojunction bipolar transistors (HBTs). Such resistors can be fabricated with no extra processing steps when the HBTs are made. Because a number of such resistors can be fabricated from different layers of a stack (e.g., emitter layer, base layer, and ion-implanted base layer of an HBT), flexibility in resistance values and die size reduction are possible.

Figure 16:
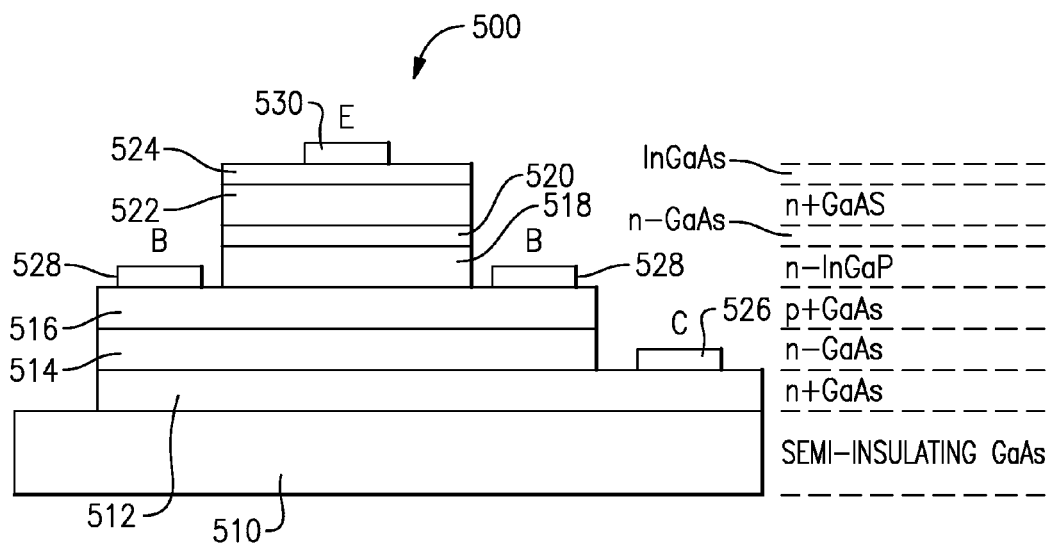
FIG. 16 illustrates an embodiment of an HBT having a stack of layers formed on a semiconductor substrate (e.g., semi-insulating GaAs).

FIG. 16 shows an example of an HBT 500 having a stack of layers formed on a semiconductor substrate 510 (e.g., semi-insulating GaAs). As described herein by way of examples, different layers of such a stack can be utilized as a semiconductor resistor. It will be understood that, although such examples are described in the context of an HBT structure, semiconductor resistors can also be formed based on layers associated with other types of stack devices. Further, although various examples of layer materials are described in the context of those shown in FIG. 16, it will be understood that other materials can also be utilized.

As shown in FIG. 16, a sub-collector layer 512 (e.g., n+ GaAs) can be formed over the substrate 510. A collector layer 514 (e.g., n-GaAs) can be formed over the sub-collector layer 512. A base layer 516 (e.g., p+ GaAs) can be formed over the collector layer 514. An emitter layer 518 (e.g., n− InGaP) can be formed over the base layer 516. An emitter cap layer 520 (e.g., n− GaAs) can be formed over the emitter layer 518. A bottom contact layer 522 (e.g., n+ GaAs) can be formed over the emitter cap layer 520. A top contact layer 524 (e.g., InGaAs) can be formed over the bottom contact layer 522.

As further shown in FIG. 16, a collector contact 526 can be formed on the sub-collector layer 512. A base contact 528 can be formed on the base layer 516. An emitter contact 530 can be formed on the top contact layer 524.

Figure 17A:
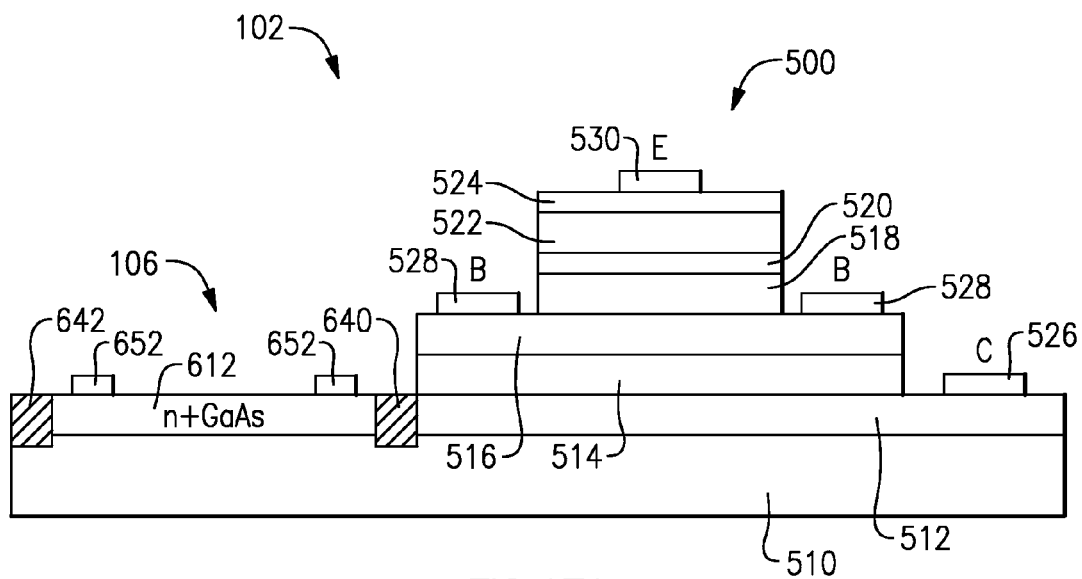
FIGS. 17A-17G illustrate embodiments of semiconductor resistors that can be formed using the various layers associated with the example HBT of FIG. 16.
Figure 17B:
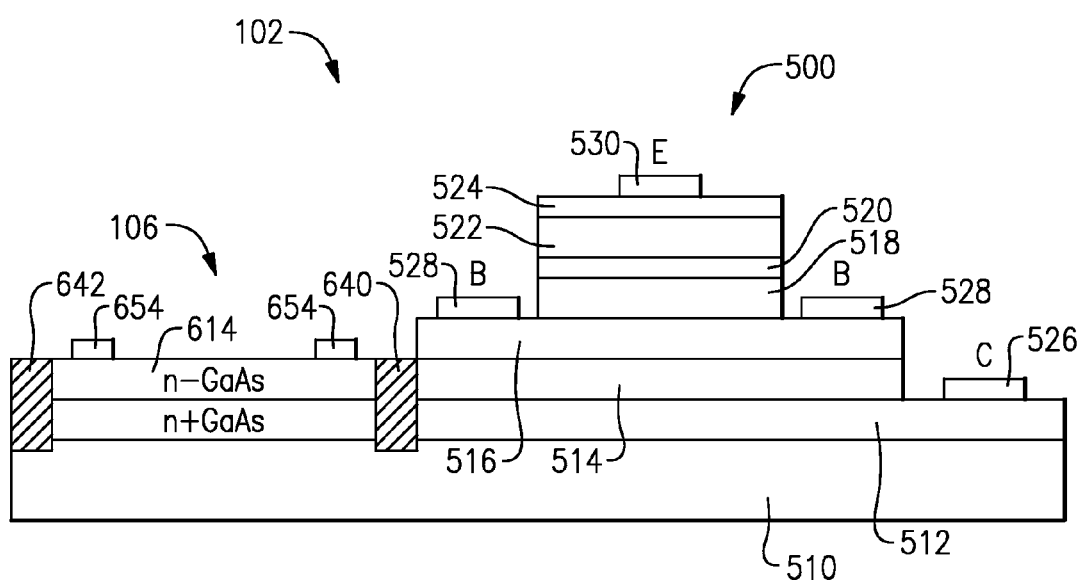
Figure 17C:
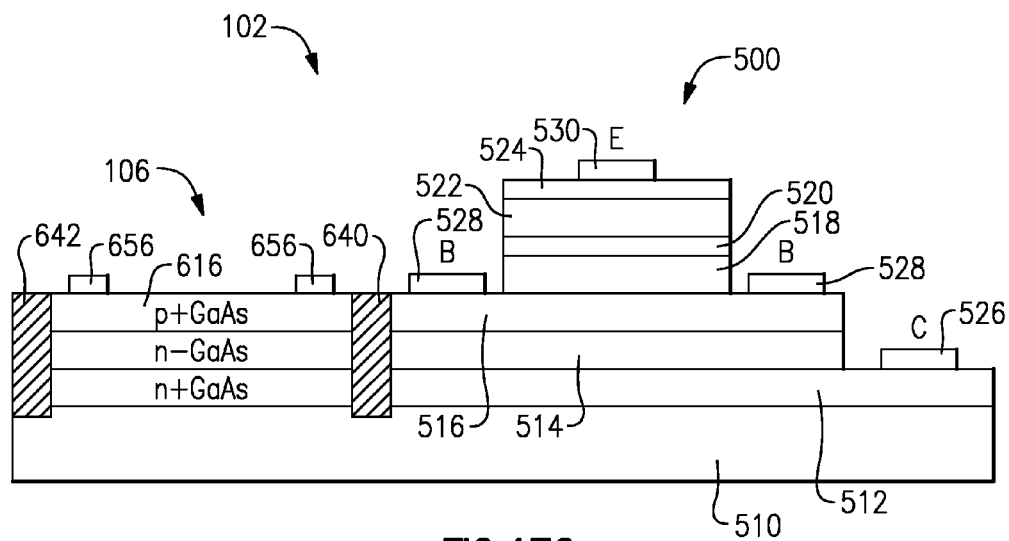
Figure 17D:
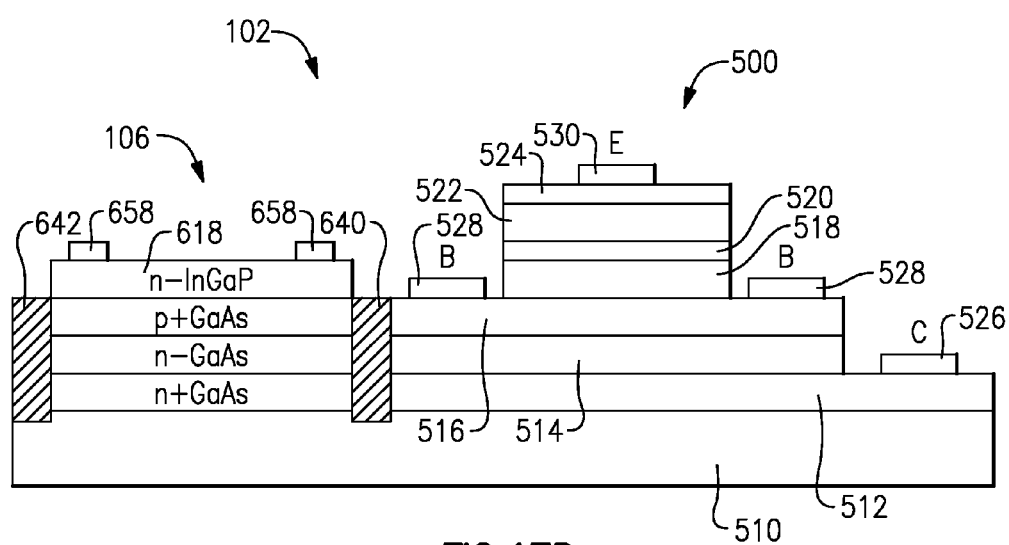
Figure 17E:
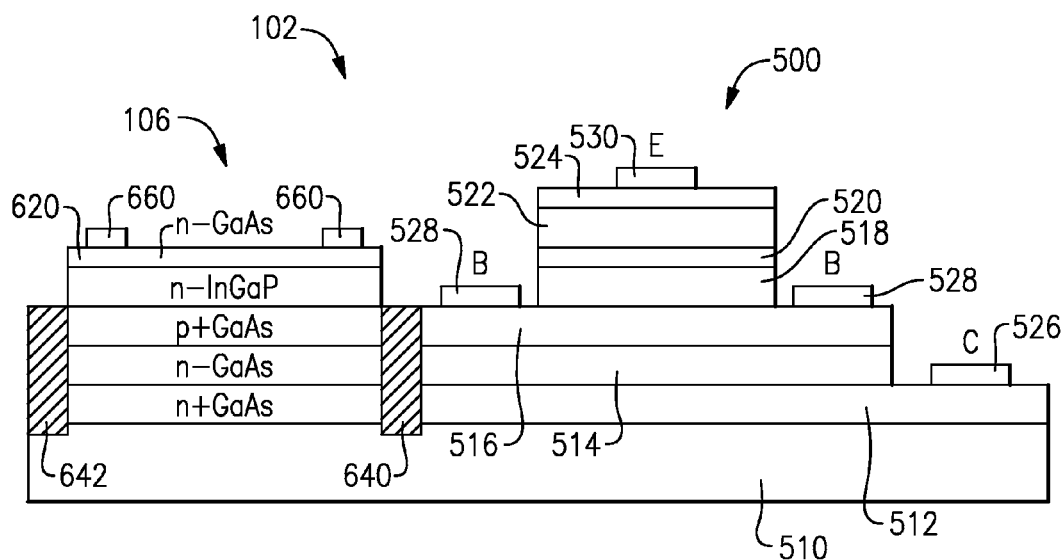
Figure 17F:
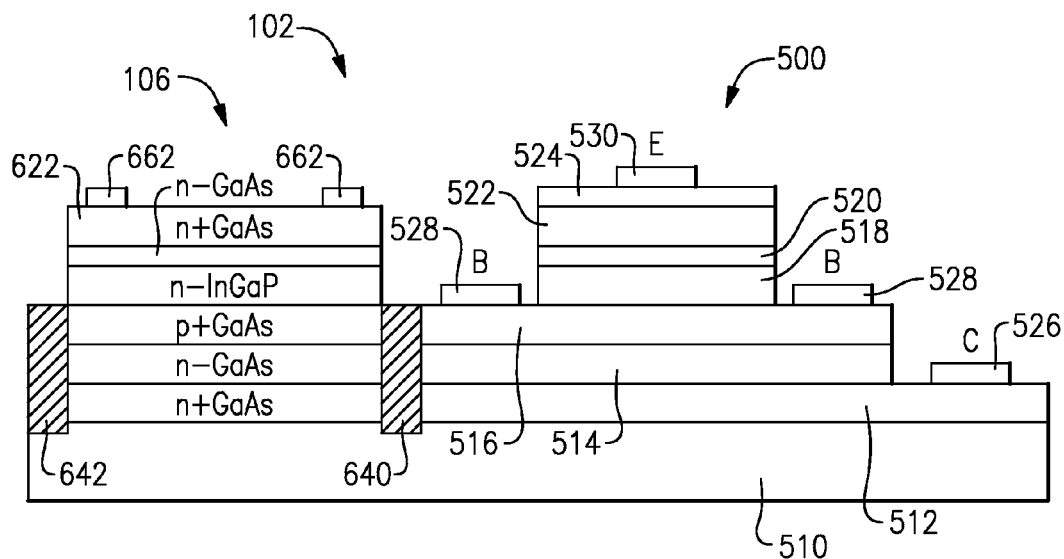
Figure 17G:
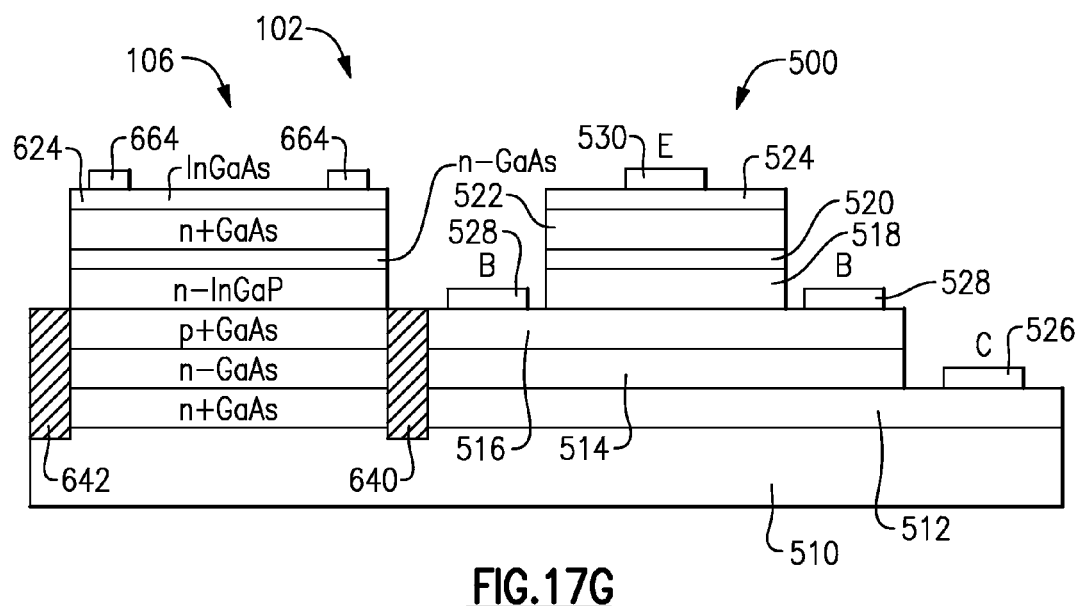
Figures 1, 17A:
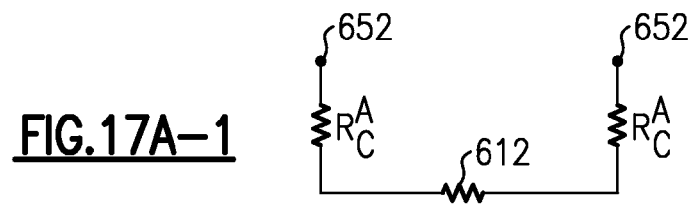
Figures 1, 17B:
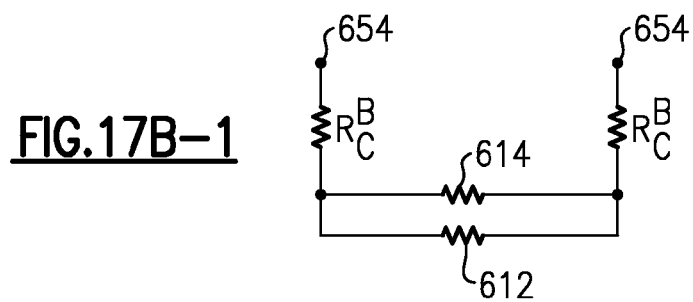
Figures 1, 17C:
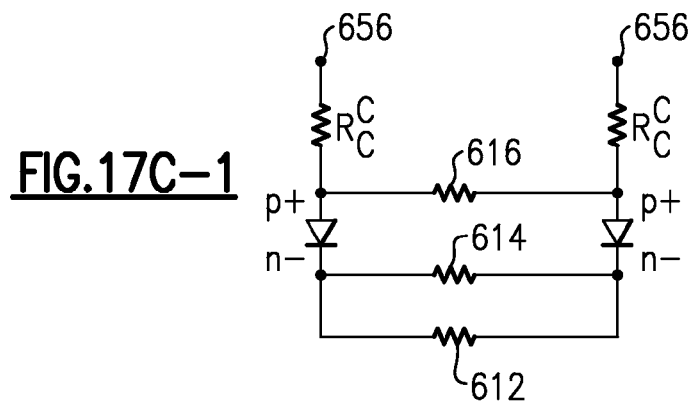
Figures 1, 17D:
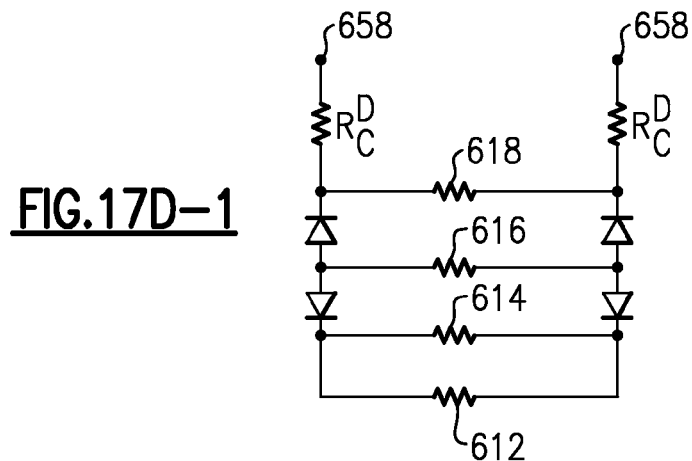
Figures 1, 17E:
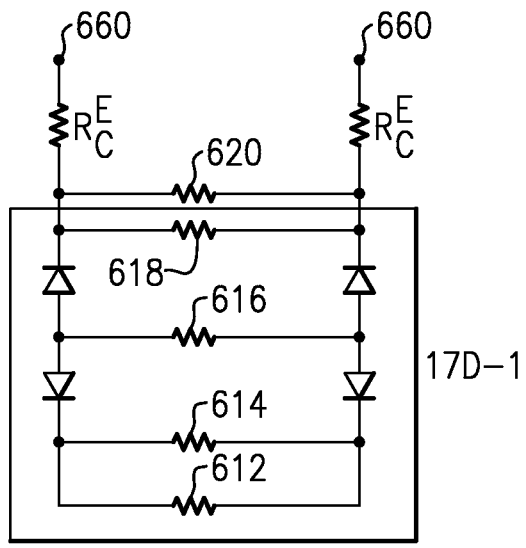
Figures 1, 17F:
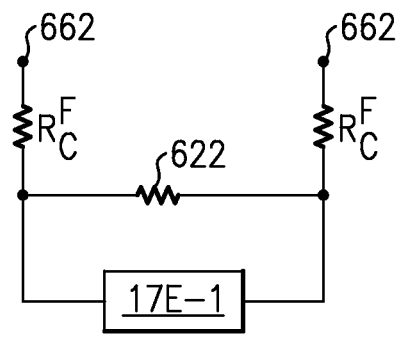
Figures 1, 17G:
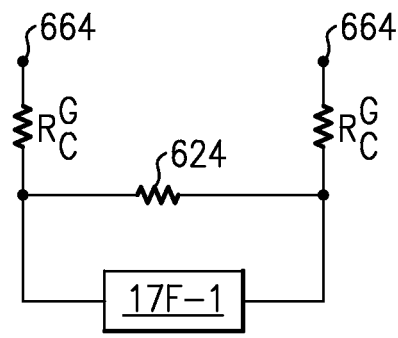

FIGS. 17A-17G show examples of semiconductor resistors that can be formed using the various layers associated with the example HBT 500 of FIG. 16. FIGS. 17A-1-17G-1 are electrical schematic diagrams of the semiconductor resistors of FIGS. 17A-17G, respectively. The resistance of the semiconductor resistors on FIGS. 17A-17G can be based on a contact resistance of a metal-semiconductor interface and the resistance of one or more semiconductor regions. In some implementations, the resistance of the semiconductor resistor can be based on a contact resistance of a metal-semiconductor interface and the resistance of two or more semiconductor regions.

In an example shown in FIG. 17A, a semiconductor resistor 106 formed on a die 102 can include an isolated resistive region 612 formed during a step that forms a sub-collector 512 of an HBT 500. Such a resistive region can be formed from, for example, n+ GaAs, and be isolated from the HBT 500 and other portions of the die 102 by isolation features 640 and 642. Electrical contacts 652 can be formed on the resistive region 612 so that the semiconductor resistor 106 can be utilized in a circuit.

In some implementations, the resistive region 612 can be masked during the formation of other upper layers of the HBT 500. Upon completion of the HBT 500, the mask over the resistive region 612 can be removed. Then, electrical contacts 652 for the resistive region 612 can be formed during the formation of other contacts (e.g., 526, 528, and 530).

FIG. 17A-1 is an electrical schematic diagram of the semiconductor resistor 106 of FIG. 17A. As shown in FIG. 17A-1, the resistance between two electrical contacts 652 can be modeled by a contact resistance of a metal-semiconductor interface $R_C^A$ in series with a resistance of the resistive region 612 and another contact resistance of the metal-semiconductor interface $R_C^A$. Contact resistance of a metal-semiconductor interface Rc can be proportional to $\exp(\phi Bn/\sqrt{Nd})$, in which φBn is the barrier height (which depends on the workfunction of the contact metal) and Nd is the doping concentration of the semiconductor material abutting the contact metal. The contact resistances in FIGS. 17A-1-17G-1 are different from each other when the semiconductor layers abutting the electrical contacts have different doping concentrations. The different contact resistances in FIGS. 17A-1-17G-1 can contribute to a semiconductor resistor 106 having a selected resistance value.

In an example shown in FIG. 17B, a semiconductor resistor 106 formed on a die 102 can include an isolated resistive region 614 formed during a step that forms a collector 514 of an HBT 500. Such a resistive region can be formed from, for example, n−GaAs, and be isolated from the HBT 500 and other portions of the die 102 by isolation features 640, 642. Electrical contacts 654 can be formed on the resistive region 614 so that the semiconductor resistor 106 can be utilized in a circuit.

In some implementations, the resistive region 614 can be masked during the formation of other upper layers of the HBT 500. Upon completion of the HBT 500, the mask over the resistive region 614 can be removed. Then, electrical contacts 654 for the resistive region 614 can be formed during the formation of other contacts (e.g., 526, 528, and 530).

FIG. 17B-1 is an electrical schematic diagram of the semiconductor resistor 106 of FIG. 17B. The schematic diagram of FIG. 17B-1 has a different contact resistance value than the schematic diagram of FIG. 17A-1. In addition, the schematic diagram of FIG. 17B-1 also includes the resistance of the resistive region 614 in parallel with the resistance of the resistive region 612. As shown in FIG. 17B-2, the resistance between two electrical contacts 654 can be modeled by a contact resistance of a metal-semiconductor interface $R_C^B$ in series with a parallel resistance of the resistive region 612 and the resistive region 614, and further in series with another contact resistance of the metal-semiconductor interface $R_C^B$.

In an example shown in FIG. 17C, a semiconductor resistor 106 formed on a die 102 can include an isolated resistive region 616 formed during a step that forms a base 516 of an HBT 500. Such a resistive region can be formed from, for example, p+ GaAs, and be isolated from the HBT 500 and other portions of the die 102 by isolation features 640, 642. Electrical contacts 656 can be formed on the resistive region 616 so that the semiconductor resistor 106 can be utilized in a circuit.

In some implementations, the resistive region 616 can be masked during the formation of other upper layers of the HBT 500. Upon completion of the HBT 500, the mask over the resistive region 616 can be removed. Then, electrical contacts 656 for the resistive region 616 can be formed during the formation of other contacts (e.g., 526, 528, and 530).

FIG. 17C-1 is an electrical schematic diagram of the semiconductor resistor 106 of FIG. 17C. The schematic diagram of FIG. 17C-1 has a different contact resistance value that the schematic diagrams of FIGS. 17A-1 and 17B-1. The schematic diagram of FIG. 17C-1 includes diodes at the PN junctions between the resistive region 614 and the resistive region 616. One of these diodes should be reverse biased. Accordingly, the resistances of the resistive regions 612 and 614 should not significantly contribute to the resistance between the electrical contacts 656. Thus, the resistance between electrical contacts 656 can be approximated by a contact resistance of a metal-semiconductor interface $R_C^C$ in series with a resistance of the resistive region 616, and further in series with another contact resistance of the metal-semiconductor interface $R_C^C$.

In an example shown in FIG. 17D, a semiconductor resistor 106 formed on a die 102 can include an isolated resistive region 618 formed during a step that forms an emitter 518 of an HBT 500. Such a resistive region can be formed from, for example, n– InGaP, and be isolated from the HBT 500 and other portions of the die 102. Electrical contacts 658 can be formed on the resistive region 618 so that the semiconductor resistor 106 can be utilized in a circuit.

In some implementations, the resistive region 618 can be masked during the formation of other upper layers of the HBT 500. Upon completion of the HBT 500, the mask over the resistive region 618 can be removed. Then, electrical contacts 658 for the resistive region 618 can be formed during the formation of other contacts (e.g., 526, 528, and 530).

FIG. 17D-1 is an electrical schematic diagram of the semiconductor resistor 106 of FIG. 17D. The schematic diagram of FIG. 17D-1 includes the diodes at the PN junctions between the resistive region 618 and the resistive region 616. One of these diodes should be reverse biased. Accordingly, the resistances of the resistive regions 612, 614, and 616 should not significantly contribute to the resistance between the electrical contacts 658. Thus, the resistance between electrical contacts 658 can be approximated by a contact resistance of a metal-semiconductor interface $R_C^D$ in series with a resistance of the resistive region 618 and another contact resistance of the metal-semiconductor interface $R_C^D$.

In an example shown in FIG. 17E, a semiconductor resistor 106 formed on a die 102 can include an isolated resistive region 620 formed during a step that forms an emitter cap 520 of an HBT 500. Such a resistive region can be formed from, for example, n– GaAs, and be isolated from the HBT 500 and other portions of the die 102. Electrical contacts 660 can be formed on the resistive region 620 so that the semiconductor resistor 106 can be utilized in a circuit.

In some implementations, the resistive region 620 can be masked during the formation of other upper layers of the HBT 500. Upon completion of the HBT 500, the mask over the resistive region 620 can be removed. Then, electrical contacts 660 for the resistive region 620 can be formed during the formation of other contacts (e.g., 526, 528, and 530).

FIG. 17E-1 is an electrical schematic diagram of the semiconductor resistor 106 of FIG. 17E. The schematic diagram of FIG. 17E-1 is similar to the schematic diagram of FIG. 17D-1, except that a resistance of the resistive region 620 is included in parallel with the resistance of resistive region 618 and the contact resistance of a metal-semiconductor interface is different. The resistance between electrical contacts 660 can be approximated by a contact resistance of a metal-semiconductor interface $R_C^E$ in series with a parallel resistance of the resistive regions 618 and 620, and further in series with another contact resistance of the metal-semiconductor interface $R_C^E$.

In an example shown in FIG. 17F, a semiconductor resistor 106 formed on a die 102 can include an isolated resistive region 622 formed during a step that forms a bottom contact layer 522 of an HBT 500. Such a resistive region can be formed from, for example, n+ GaAs, and be isolated from the HBT 500 and other portions of the die 102. Electrical contacts 662 can be formed on the resistive region 622 so that the semiconductor resistor 106 can be utilized in a circuit.

In some implementations, the resistive region 622 can be masked during the formation of other upper layer(s) of the HBT 500. Upon completion of the HBT 500, the mask over the resistive region 622 can be removed. Then, electrical contacts 662 for the resistive region 622 can be formed during the formation of other contacts (e.g., 526, 528, and 530).

FIG. 17F-1 is an electrical schematic diagram of the semiconductor resistor 106 of FIG. 17F. The schematic diagram of FIG. 17F-1 is similar to the schematic diagram of FIG. 17E-1, except that a resistance of the resistive region 622 is included in parallel with the resistance of resistive regions 618 and 620 and the contact resistance of a metal-semiconductor interface is different. The resistance between contacts 662 can be approximated by a contact resistance of a metal-semiconductor interface $R_C^F$ in series with a parallel resistance of the resistive regions 618, 620, and 622, and further in series with another contact resistance of the metal-semiconductor interface $R_C^F$.

In an example shown in FIG. 17G, a semiconductor resistor 106 formed on a die 102 can include an isolated resistive region 624 formed during a step that forms a top contact layer 524 of an HBT 500. Such a resistive region can be formed from, for example, InGaAs, and be isolated from the HBT 500 and other portions of the die 102. Electrical contacts 664 can be formed on the resistive region 624 so that the semiconductor resistor 106 can be utilized in a circuit.

In some implementations, the resistive region 624 can be masked during the formation of any other upper layer(s) of the HBT 500. Upon completion of the HBT 500, the mask over the resistive region 624 can be removed. Then, electrical contacts 664 for the resistive region 624 can be formed during the formation of other contacts (e.g., 526, 528, and 530).

FIG. 17G-1 is an electrical schematic diagram of the semiconductor resistor 106 of FIG. 17G. The schematic diagram of FIG. 17G-1 is similar to the schematic diagram of FIG. 17F-1, except that a resistance of the resistive region 624 is included in parallel with the resistance of resistive regions 618, 620, and 622 and the contact resistance of a metal-semiconductor interface is different. The resistance between electrical contacts 664 can be approximated by a contact resistance of a metal-semiconductor interface $R_C^G$ in series with a parallel resistance of the resistive regions 618, 620, 622, and 624, and further in series with another contact resistance of the metal-semiconductor interface $R_C^G$.

In the example configurations of FIGS. 17A-17G, the resistive region of the top layer of the resistor 106 may be representative of the corresponding layer in the HBT 500 stack. Thus, for example, the resistive region 614 corresponds to the collector 514. Similarly, the resistive region 616 corresponds to the base 516. The resistance of one or more resistive regions in the resistor 106 may contribute to the total resistance of the resistor 106. In some cases, the resistance of two or more resistive regions in the resistor 106 may contribute to the total resistance of the resistor 106. As discussed above, in some implementations, lower layers can have a relatively minor contribution to the resistance of the semiconductor resistor 106 compared to the contribution from the one or more upper layers that include electrical contacts. In some cases, the resistance of the top layer of the resistor 106 may correlate to a measurement of a characteristic of the corresponding layer of the HBT 500.

Figure 18A:
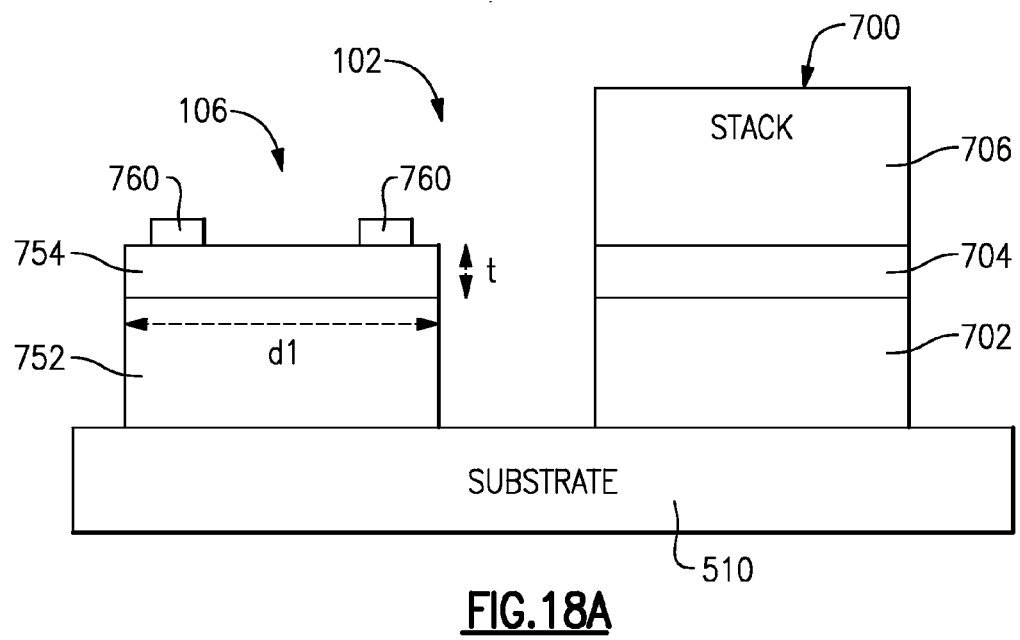
FIGS. 18A and 18B illustrate embodiments of a semiconductor resistor that can have a thickness "t" that is substantially the same as that of the selected layer of the stack, and lateral dimensions "d1" and "d2."

The example configurations of FIGS. 17A-17G show that a selected one of some or all of the layers in a stack device can be utilized to form a semiconductor resistor. Such a concept is schematically depicted in FIG. 18A, where a die 102 is shown to include a stack device having a plurality of layers. Among such a plurality of layers is a selected layer 704; and there may be additional layers above (collectively depicted as 706) and/or below (collectively depicted as 702). To form a resistive region 754 corresponding to the selected layer 704, layer(s) collectively depicted as 752 can be formed during the formation of the corresponding lower portion 702 (if it exists). Then, the desired resistive region 754 can be formed during the formation of the selected layer 704. If the upper portion 706 of the stack 700 needs to be formed, then the resistive region 754 can be masked during such formation steps. Upon completion of such steps, the mask can be removed to allow formation of electrical contacts 760. The resulting resistive region 754 with the contacts 760 then forms a semiconductor resistor 106.

Figure 18B:
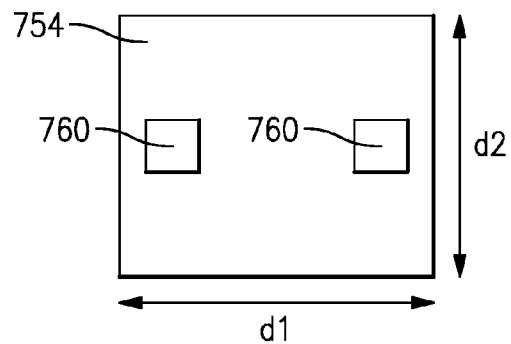

In some embodiments, the resistive region 754 can have a thickness "t" that is substantially the same as that of the selected layer 704 of the stack 700, and lateral dimensions "d1" and "d2" as shown in FIGS. 18A and 18B. Such dimensions can be selected to yield features such as desired resistance and footprint size of the resistor 106. Further, as previously described, in some cases the resistance of the resistor 106 may come primarily from the layer with the electrical contacts. Thus, in some cases, the thickness "t" of the top layer of the resistor 106 may correlate to the resistance of the resistor 106.

Figure 18C:
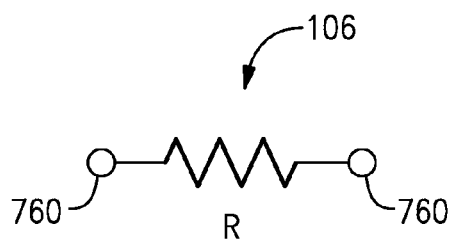
FIG. 18C illustrates an embodiment of the semiconductor resistor described in reference to FIGS. 18A and 18B can be represented as a resistor having resistance "R."

FIG. 18C shows that the semiconductor resistor 106 described in reference to FIGS. 18A and 18B can be represented as a resistor having resistance "R." Examples of how such a resistor can be utilized in different applications are described herein in greater detail.

Figure 19:
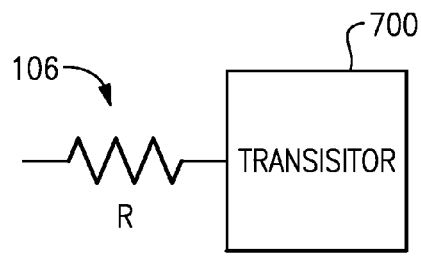
FIG. 19 illustrates an embodiment of a semiconductor resistor formed on a die and having one or more features described herein that can be coupled with a stack device, such as a transistor (e.g., an HBT) that is on the same die.
Figure 20A:
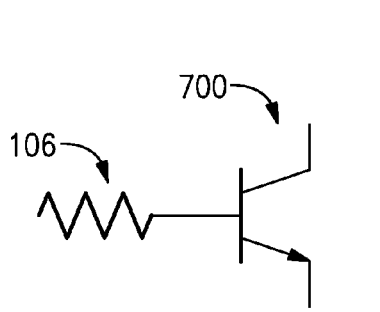
FIGS. 20A-20C illustrate embodiments for configurations of the semiconductor resister and stack device combination of FIG. 19.
Figure 20B:
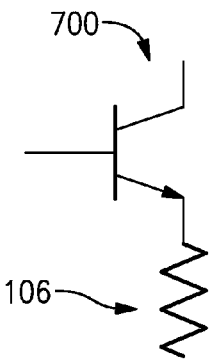
Figure 20C:
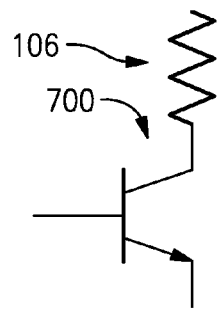

FIG. 19 shows that in some embodiments, a semiconductor resistor 106 formed on a die and having one or more features described herein can be coupled with a stack device such as a transistor 700 (e.g., an HBT) that is on the same die. FIGS. 20A-20C show examples of the configuration of FIG. 19. In the examples shown, the semiconductor resistor 106 is shown to provide ballast resistance for the base of the HBT 700 (FIG. 20A), for the emitter of the HBT 700 (in the context of the example NPN configuration, FIG. 19B), and for the collector of the HBT 700 (FIG. 19C). Additional details concerning semiconductor ballasting can be found in U.S. Pat. No. 5,378,922, titled "HBT WITH SEMICONDUCTOR BALLASTING," which is expressly incorporated by reference in its entirety and is to be considered part of the specification of the present application.

In some embodiments, a resistor 106 having one or more features as described herein can be coupled to a transistor 700 for purposes other than ballasting. In some embodiments, such a resistor may be utilized in a circuit having a transistor; but not necessarily be coupled directly with the transistor.

Figure 21:
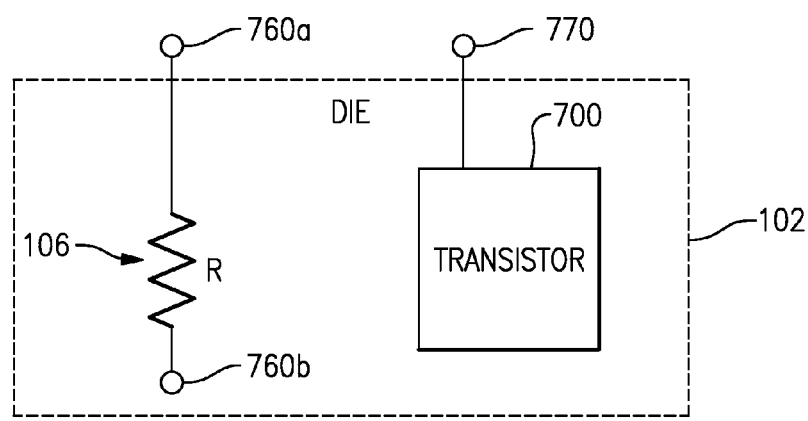
FIG. 21 illustrates an embodiment where a semiconductor resistor is formed on a die.

In some embodiments, a resistor having one or more features as described herein can be implemented on a die and be connected to another circuit located outside of the die. For example, FIG. 21 shows an example where a semiconductor resistor 106 is formed on a die 102. One terminal (760a) of the resistor 106 is shown to be configured for electrical connection to a location outside of the die 102, and the other terminal (760b) is shown to be within the die 102. The die 102 can include an integrated circuit (e.g., power amplifier circuit) having one or more transistors 700; and such a circuit can be controlled from an external circuit (e.g., through terminal 770). For example, a bias circuit located outside of the die 102 can be such an external circuit. Such a bias circuit can be connected to the resistor 106 and the transistor 700 to allow operation of the transistor based on a parameter obtained from the resistor 106. Because the resistor 106 can be formed from substantially the same material as a layer of the transistor 700, such a parameter associated with the resistor 106 can track a condition that is common to both the transistor 700 and the resistor.

In some implementations, fabrication of a semiconductor resistor having one or more features as described herein can be achieved with no additional processing steps or very little modifications of process steps, when compared to fabrication of stack structure(s) on a given die. Although the various examples are described herein in the context of HBTs, it will be understood that similar resistor structures and fabrication methods can apply to other configurations. For example, additional layers can be formed for fabricating devices that include an HBT and one or more other transistor structures. Examples of such devices include, but are not limited to, the examples described in U.S. Pat. No. 6,906,359, titled "BIFET INCLUDING A FET HAVING INCREASED LINEARITY AND MANUFACTURABILITY," and PCT Publication No. WO 2012/061632, titled "DEVICES AND METHODOLOGIES RELATED TO STRUCTURES HAVING HBT AND FET," both of which are expressly incorporated by reference in their entirety and are to be considered part of the specification of the present application.

In some embodiments, one or more features of the present disclosure can be implemented in III-V semiconductor dies. In some embodiments, such III-V semiconductor dies can include GaAs-based dies. Transistors and/or other stack structures formed on such GaAs-based dies may or may not include an HBT.

As described herein, a number of advantageous features can be provided by semiconductor resistors. Other advantages can include, for example, a desirable feature where different temperature coefficient of resistance (TCR) values is provided by selecting a material associated with the resistor layer. In another example, size of the resistor can be optimized or configured in a desirable manner because of such a range of possible resistance values (e.g., sheet resistance of about 8 ohms/sq (e.g., sub-collector) to about 1,000 Ohms/sq (e.g., implanted base layer)). In yet another example, RF roll-off of resistor can be selected and/or tuned, depending on which resistor is selected (e.g., by modifying how the 3rd terminal on the device is biased).

Figure 22A:
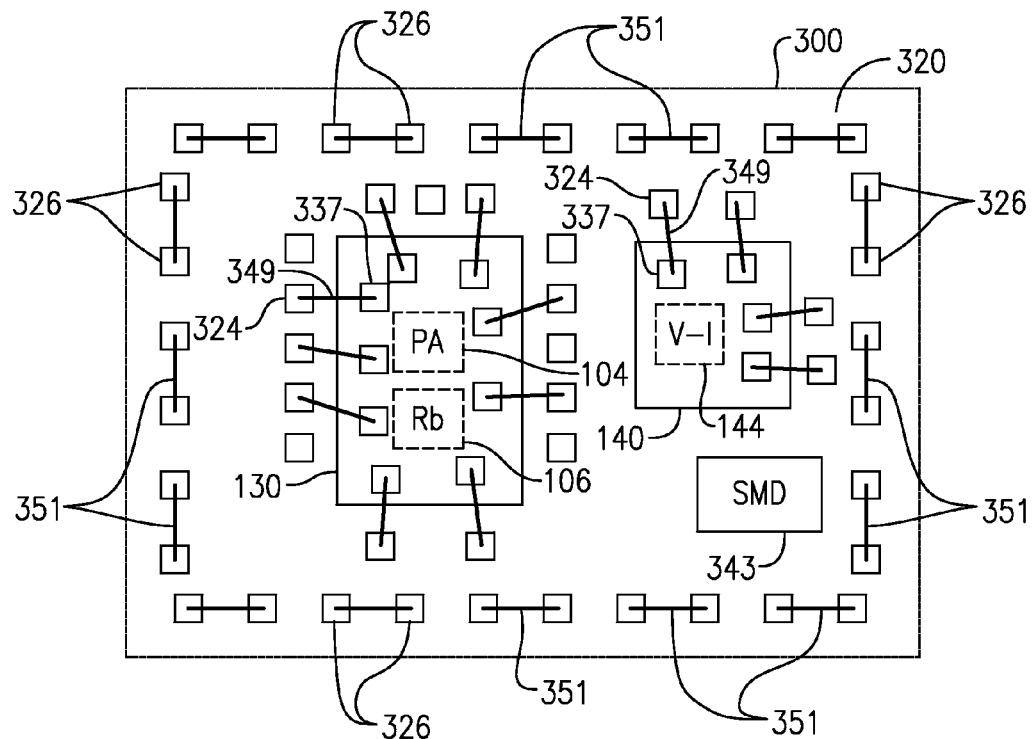
FIGS. 22A and 22B illustrate embodiments of a packaged module that can include PA and bias dies having one or more features described herein.

In some embodiments, PA and bias dies having one or more features described herein can be implemented in a packaged module. An example of such a module is shown in FIGS. 22A (plan view) and 22B (side view). A module 300 is shown to include a packaging substrate 320. Such a packaging substrate can be configured to receive a plurality of components, and can include, for example, a laminate substrate. The components mounted on the packaging substrate 320 can include one or more dies. In the example shown, a PA die (e.g., an HBT PA die 130) and a bias die (e.g., a silicon bias die 140) are shown to be mounted on the packaging substrate 320. The PA die 130 can include a PA circuit 104 and a base resistor 106 as described herein; and the bias die 140 can include a V-I circuit 144 also described herein. The dies 130, 140 can be electrically connected to other parts of the module and with each other through connections such as connection-wirebonds 349. Such connection-wirebonds can be formed between contact pads 337 formed on the dies and contact pads 324 formed on the packaging substrate 320. In some embodiments, one or more surface mounted devices (SMDs) 343 can be mounted on the packaging substrate 320 to facilitate various functionalities of the module 300.

In some embodiments, RF-shielding features such as shielding wirebonds 351 can be provided to facilitate RF-shielding of one or more components (e.g., die 130, die 140, and/or SMD 343). Such RF-shielding can inhibit passage of RF signals or noise between such components and areas outside of the module 300. In the context of the shielding-wirebonds 351, such wirebonds can be formed on contact pads 326 so that the shielding-wirebonds 351 generally form a perimeter around a desired area (e.g. near the perimeter of the module 300). Dimensions and spacing of such shielding-wirebonds can be selected to provide desired RF-shielding properties.

Figure 22B:
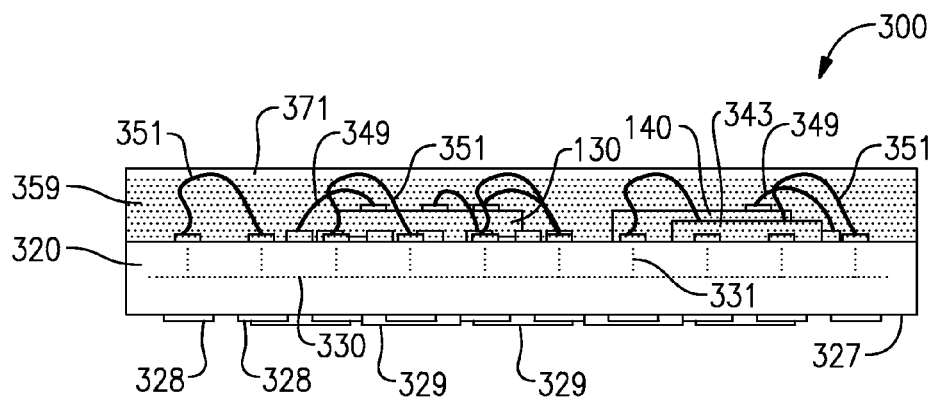

In some embodiments, a three-dimensional RF-shield structure can be provided as follows. As shown in FIG. 22B, the shielding-wirebonds 351 can be electrically connected to a ground plane 330 that is below the surface of the packaging substrate 320. Such connections between the shielding-wirebonds 351 and the ground plane 330 can be facilitated by the contact pads 326 and connection features 331 (e.g., vias). Above the shielding-wirebonds 351, a conductive layer (e.g., conductive paint layer) 371 can be provided so that the conductive layer 371 is electrically connected with upper portions of the shielding-wirebonds 351. Accordingly, the conductive layer 371, the shielding-wirebonds 351, and the ground plane 330 can form a three-dimensional RF-shield structure.

In some embodiments, the space between the packaging substrate 320 and the conductive layer 371 can be filled with an overmold structure 359. Such an overmold structure can provide a number of desirable functionalities, including protection for the components and wirebonds from external elements, and easier handling of the packaged module 300.

In some implementations, a device and/or a circuit having one or more features described herein can be included in an RF device such as a wireless device. Such a device and/or a circuit can be implemented directly in the wireless device, in a modular form as described herein, or in some combination thereof. In some embodiments, such a wireless device can include, for example, a cellular phone, a smart-phone, a handheld wireless device with or without phone functionality, a wireless tablet, etc.

Figure 23:
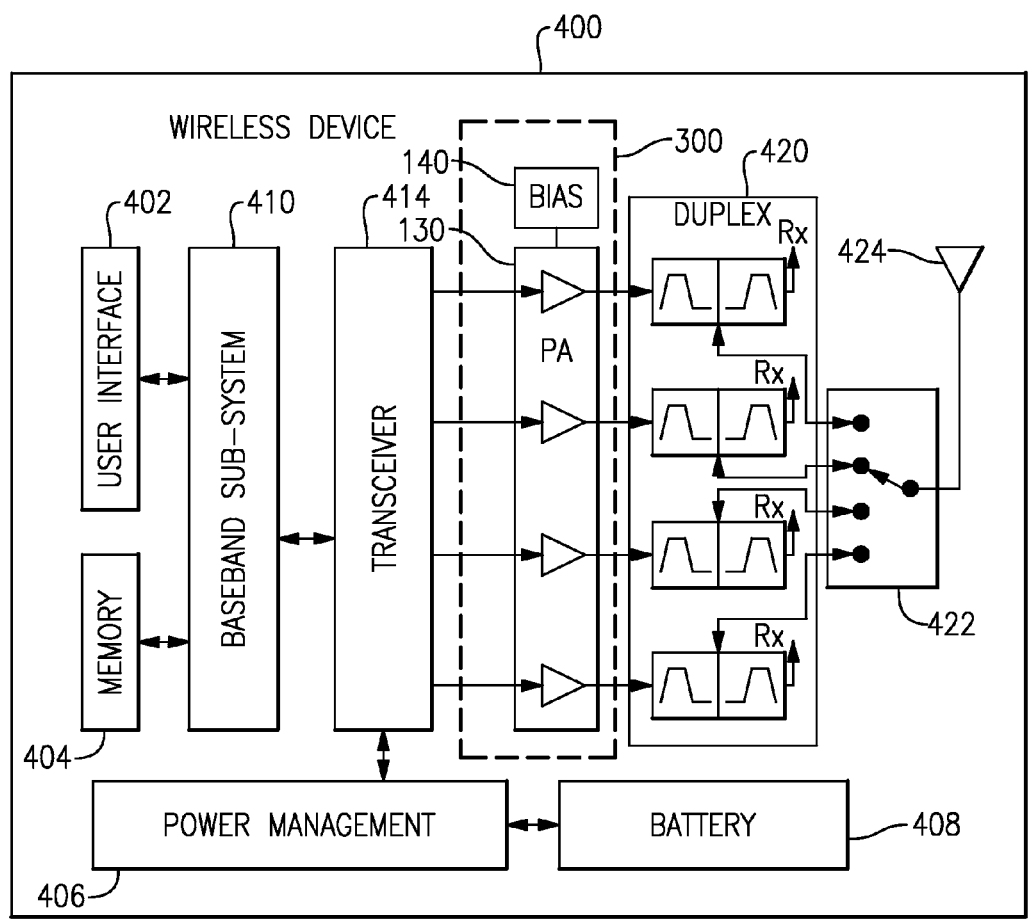
FIG. 23 illustrates an embodiment of a wireless device having one or more advantageous features described herein.

FIG. 23 schematically depicts an example wireless device 400 having one or more advantageous features described herein. In the context of biasing of PAs as described herein, a PA die 130 having one or more PAs can be part of a module 300. Such a module can also include a bias die 140 having one or more features as described herein. In some embodiments, such a PA module can facilitate, for example, multi-band operation of the wireless device 400.

The PAs in the module 300 can receive their respective RF signals from a transceiver 414 that can be configured and operated in known manners to generate RF signals to be amplified and transmitted, and to process received signals. The transceiver 414 is shown to interact with a baseband sub-system 410 that is configured to provide conversion between data and/or voice signals suitable for a user and RF signals suitable for the transceiver 414. The transceiver 414 is also shown to be connected to a power management component 406 that is configured to manage power for the operation of the wireless device. Such power management can also control operations of the baseband sub-system 410 and the module 300.

The baseband sub-system 410 is shown to be connected to a user interface 402 to facilitate various input and output of voice and/or data provided to and received from the user. The baseband sub-system 410 can also be connected to a memory 404 that is configured to store data and/or instructions to facilitate the operation of the wireless device, and/or to provide storage of information for the user.

In the example wireless device 400, outputs of the PAs of the module 300 can be matched by a matching network and routed to an antenna 424 via their respective duplexers 420 and a band-selection switch 422. In some embodiments, each duplexer can allow transmit and receive operations to be performed simultaneously using a common antenna (e.g., antenna 424). In FIG. 16, received signals are shown to be routed to "Rx" paths (not shown) that can include, for example, a low-noise amplifier (LNA).

A number of other wireless device configurations can utilize one or more features described herein. For example, a wireless device does not need to be a multi-band device. In another example, a wireless device can include additional antennas such as diversity antenna, and additional connectivity features such as Wi-Fi, Bluetooth, and GPS.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A system for biasing a power amplifier, the system comprising:
   a first die including a power amplifier circuit, a semiconductor resistor, and an isolation feature, the power amplifier circuit including a transistor formed on a semiconductor, the semiconductor resistor formed from one or more layers as a layer stack device on the semiconductor that includes the transistor, the isolation feature configured to isolate the semiconductor resistor from the transistor, the semiconductor resistor configured to sense a beta parameter of the power amplifier circuit, the beta parameter dependent on characteristics of the first die; and
   a second die including a bias signal generating circuit that is configured to generate a bias signal based at least in part on a measurement of the beta parameter sensed by the semiconductor resistor of the first die.

2. The system of claim 1 wherein the first die includes a heterojunction bipolar transistor (HBT) die, and the second die includes a silicon die.

3. The system of claim 2 wherein the semiconductor resistor is formed from a portion of the HBT die.

4. The system of claim 3 wherein the semiconductor resistor is formed from a base material of the HBT die.

5. The system of claim 1 wherein the semiconductor resistor has a resistance value that is approximately proportional to a temperature of the first die.

6. The system of claim 3 wherein the bias signal generating circuit includes a V-I circuit configured to provide a reference current to the semiconductor resistor, the reference current having a value that depends on the resistance of the semiconductor resistor.

7. The system of claim 6 wherein the V-I circuit provides the reference current based on a PTAT reference voltage that is substantially independent of the one or more conditions of the first die.

8. The system of claim 6 wherein the V-I circuit is further configured to generate the bias signal based on the reference current drawn by the semiconductor resistor.

9. A wireless device comprising:
   a transceiver configured to process RF signals;
   an antenna in communication with the transceiver configured to facilitate transmission of an amplified RF signal;
   a power amplifier including a transistor formed on a semiconductor of a first die, the power amplifier connected to the transceiver and configured to generate the amplified RF signal, the first die including a semiconductor resistor and an isolation feature, the semiconductor resistor formed from one or more layers as a layer stack device on the semiconductor that includes the transistor, the isolation feature configured to isolate the semiconductor resistor from the transistor, the semiconductor resistor configured to sense a beta parameter of the power amplifier, the beta parameter dependent on characteristics of the first die; and
   a bias circuit disposed on a second die and interconnected to the power amplifier, the bias circuit configured to generate a bias signal for the power amplifier based at least in part on a measurement of the beta parameter sensed by the semiconductor resistor of the first die.

10. A power amplifier module comprising:
    a packaging substrate configured to receive a plurality of components;
    a first die mounted on the packaging substrate, the first die including a power amplifier circuit, a semiconductor resistor, and an isolation feature, the power amplifier circuit including a transistor formed on a semiconductor, the semiconductor resistor formed from one or more layers as a layer stack device on the semiconductor that includes the transistor, the isolation feature configured to isolate the semiconductor resistor from the transistor, the semiconductor resistor configured to sense a beta parameter of the power amplifier circuit, the beta parameter dependent on characteristics of the first die; and
    a second die mounted on the packaging substrate and interconnected with the first die, the second die including a bias signal generating circuit that is configured to generate a bias signal based at least in part on a measurement of the beta parameter sensed by the semiconductor resistor of the first die.

11. The power amplifier module of claim 10 wherein the first die includes a III-V semiconductor die mounted on the packaging substrate, the first die including an HBT having a selected layer above a sub-collector layer, the semiconductor resistor having a resistive layer disposed laterally from, and electrically isolated from the selected layer, the resistive layer and the selected layer formed from substantially the same material.

12. The power amplifier module of claim 11 wherein the selected layer includes a base layer.

13. The power amplifier module of claim 11 wherein the selected layer includes a sub-collector layer.

14. The power amplifier module of claim 11 wherein the semiconductor resistor further includes electrical contact pads disposed on the resistive layer to yield a resistance value for the semiconductor resistor.

15. The power amplifier module of claim 11 wherein the semiconductor resistor is connected to a circuit located outside of the first die.

16. The power amplifier module of claim 11 wherein the semiconductor resistor is configured to be sensitive to a change in one or more conditions associated with the selected layer of the HBT.

17. The system of claim 1 wherein the semiconductor resistor is a substitute for a thin-film resistor.

18. The wireless device of claim 9 wherein the semiconductor resistor is a substitute for a thin-film resistor.

* * * * *